(12) United States Patent    (10) Patent No.:     US 12,294,319 B2
Furutani et al.              (45) Date of Patent:         May 6, 2025

(54) MOTOR IRON-LOSS CALCULATION DEVICE AND MOTOR CONTROL DEVICE COMPRISING SAME

(71) Applicant: Mitsubishi Electric Corporation, Tokyo (JP)

(72) Inventors: Shinichi Furutani, Tokyo (JP); Shoji Adachi, Tokyo (JP)

(73) Assignee: MITSUBISHI ELECTRIC CORPORATION, Tokyo (JP)

( * ) Notice: Subject to any disclaimer, the term of this patent is extended or adjusted under 35 U.S.C. 154(b) by 211 days.

(21) Appl. No.: 18/008,675

(22) PCT Filed: Aug. 5, 2020

(86) PCT No.: PCT/JP2020/029927
§ 371 (c)(1),
(2) Date: Dec. 7, 2022

(87) PCT Pub. No.: WO2022/029911
PCT Pub. Date: Feb. 10, 2022

(65) Prior Publication Data
US 2023/0216439 A1    Jul. 6, 2023

(51) Int. Cl.
*H02P 21/10* (2016.01)
*G01R 19/00* (2006.01)
*H02P 21/20* (2016.01)
*H02P 29/032* (2016.01)

(52) U.S. Cl.
CPC .......... *H02P 21/10* (2013.01); *G01R 19/0092* (2013.01); *H02P 21/20* (2016.02); *H02P 29/032* (2016.02)

(58) Field of Classification Search
CPC ........ H02P 21/10; H02P 21/20; H02P 29/032; G01R 19/0092
See application file for complete search history.

(56) References Cited

U.S. PATENT DOCUMENTS

| | | | |
|---|---|---|---|
| 5,594,670 A * | 1/1997 | Yamamoto | G01R 31/343 700/304 |
| 9,667,187 B2 * | 5/2017 | Yoshimoto | H02P 23/02 |
| 10,418,929 B2 * | 9/2019 | Aizawa | H02P 6/16 |
| 2007/0200528 A1 * | 8/2007 | Itou | H02P 21/06 318/719 |
| 2011/0050141 A1 * | 3/2011 | Yeh | H02P 29/664 318/434 |

(Continued)

FOREIGN PATENT DOCUMENTS

| | | |
|---|---|---|
| JP | 2712632 B2 | 2/1998 |
| JP | 2000-102289 A | 4/2000 |

(Continued)

OTHER PUBLICATIONS

Office Action issued on Sep. 12, 2023, in corresponding Japanese patent Application No. 2022-541395,.

(Continued)

*Primary Examiner* — Rina I Duda
(74) *Attorney, Agent, or Firm* — XSENSUS LLP

(57) ABSTRACT

A motor iron-loss calculation device calculates an iron-loss value of a motor on the basis of a primary frequency and a q-axis current component in a dq-axis rotating coordinate system having a d axis in a rotor magnetic flux direction of the motor.

20 Claims, 20 Drawing Sheets

(56) References Cited

U.S. PATENT DOCUMENTS

| | | | | |
|---|---|---|---|---|
| 2012/0200243 A1* | 8/2012 | Kono | ..................... | B60L 7/14 318/376 |
| 2013/0088179 A1 | 4/2013 | Kobayashi et al. | | |

FOREIGN PATENT DOCUMENTS

| | | | |
|---|---|---|---|
| JP | 2000-102298 | A | 4/2000 |
| JP | 2001-28892 | A | 1/2001 |
| JP | 2009-291072 | A | 12/2009 |
| JP | 2013-85377 | A | 5/2013 |
| JP | 2017-5848 | A | 1/2017 |
| JP | 6468826 | B2 | 2/2019 |
| JP | 2019-213247 | A | 12/2019 |
| WO | 2011/070651 | A1 | 6/2011 |

OTHER PUBLICATIONS

Office Action issued May 9, 2023 in Japanese Patent Application No. 2022-541395 with computer-generated English translation thereof, 10 pages.

International Search Report and Written Opinion mailed on Oct. 13, 2020, received for PCT Application No. PCT/JP2020/029927, filed on Aug. 5, 2020, 14 pages including English Translation.

* cited by examiner

MOTOR IRON-LOSS CALCULATION DEVICE AND MOTOR CONTROL DEVICE COMPRISING SAME

CROSS-REFERENCE TO RELATED APPLICATION

The present application is based on PCT filing PCT/JP2020/029927, filed Aug. 5, 2020, the entire contents of which are incorporated herein by reference.

TECHNICAL FIELD

The present disclosure relates to a motor iron-loss calculation device and a motor control device including the same.

BACKGROUND ART

When a motor converts electric power to mechanical power, loss occurs due to the conversion. Such loss mainly includes copper loss which is loss in the electric resistance of a motor winding, and iron loss in a motor core. In motor output control, there is a method of performing torque control by calculating generated torque, and as a method for calculating generated torque, one of conventional methods is described in Patent Document 1, in which iron loss is calculated and generated torque is calculated on the basis of the calculated iron-loss value.

In the conventional iron-loss calculation described in Patent Document 1, iron loss W is separated into hysteresis loss Wh and eddy current loss We, and they are calculated by the following expressions.

$$W = Wh + We$$

$$Wh = \sigma h \cdot f1 \cdot Bm^2$$

$$We = \sigma e \cdot d^2 \cdot f1^2 \cdot BmA^2$$

Here, f1 is a primary frequency, Bm is the maximum value of the magnetic flux density of the core (maximum value of the amplitude of the magnetic flux density), $\sigma h$ is a constant determined by the core material, $\sigma e$ is a constant determined by the resistivity of the core, and d is the thickness of the core.

CITATION LIST

Patent Document

Patent Document 1: Japanese Laid-Open Patent Publication No. 2000-102298

SUMMARY OF THE INVENTION

Problems to be Solved by the Invention

In the conventional iron-loss calculation described in Patent Document 1, calculation is performed on the basis of theoretical expressions using information of the magnetic material, and when the operation state of the motor is changed, it is difficult to accurately calculate iron loss in accordance with the operation state.

The present disclosure has been made to solve the above problem, and an object of the present disclosure is to provide a motor iron-loss calculation device capable of accurately calculating iron loss of a motor in accordance with the operation state of a motor.

Another object of the present disclosure is to provide a motor control device that includes the above motor iron-loss calculation device and is capable of reliably controlling a motor by accurately calculating iron loss of the motor.

Solution to the Problems

A motor iron-loss calculation device according to the present disclosure calculates an iron-loss value of a motor on the basis of a primary frequency of the motor and a q-axis current component in a dq-axis rotating coordinate system having a d axis in a rotor magnetic flux direction of the motor.

A motor control device according to the present disclosure detects current in a dq-axis rotating coordinate system having a d axis in a rotor magnetic flux direction of a motor and generates a voltage command so that the detected current follows a command value. A phase of the dq-axis rotating coordinate system calculated on the basis of a given primary frequency is used in coordinate conversion between the dq-axis rotating coordinate system and a three-phase coordinate system at rest, for both of the detected current and the voltage command. The motor control device includes the above motor iron-loss calculation device, to calculate the iron-loss value of the motor.

Effect of the Invention

The motor iron-loss calculation device according to the present disclosure can accurately calculate iron loss in accordance with the operation state of a motor.

The motor control device according to the present disclosure can accurately calculate iron loss in accordance with the operation state of a motor and thus can reliably control the motor.

DESCRIPTION OF EMBODIMENTS

Embodiment 1

Figure 1:
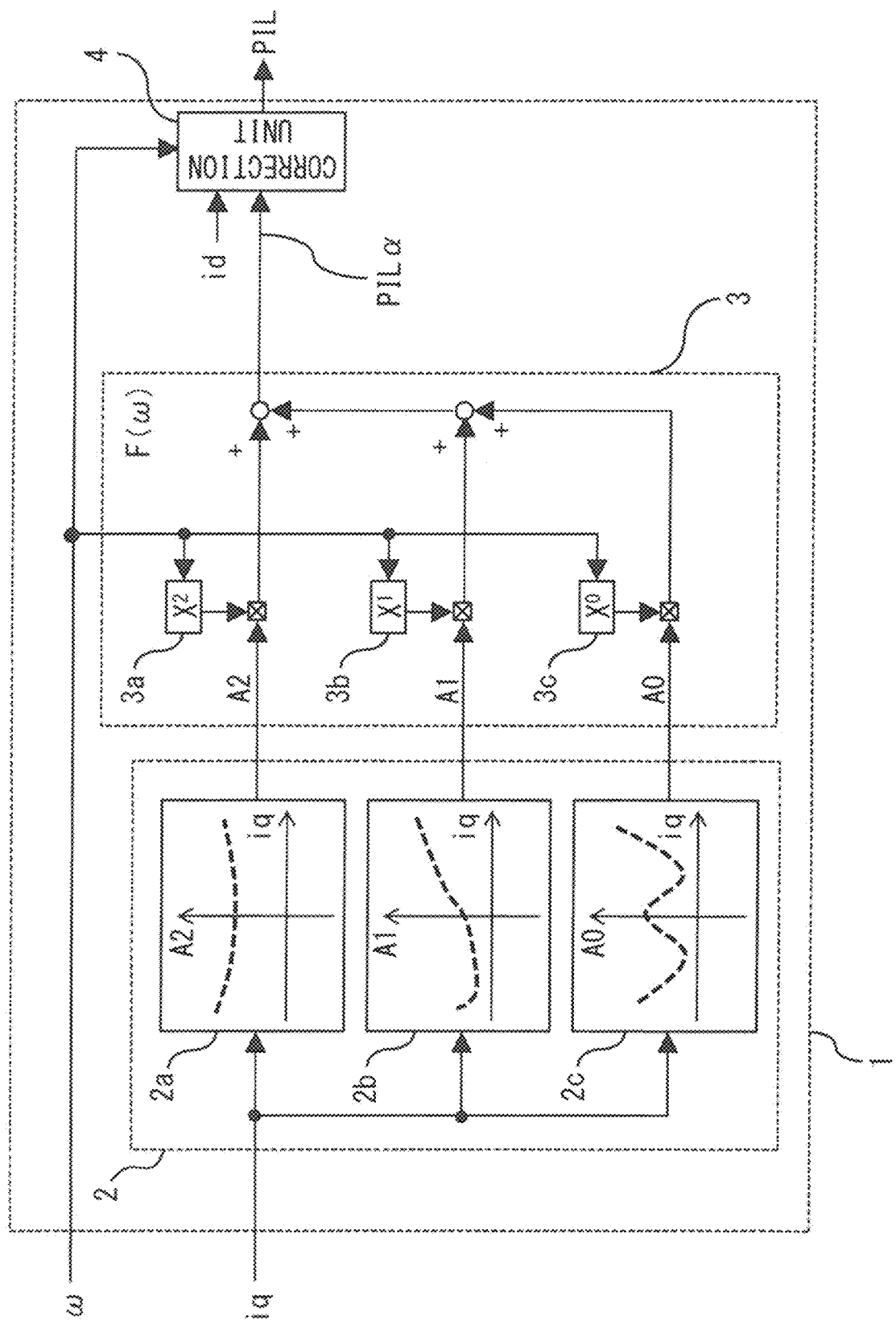
FIG. 1 shows the configuration of a motor iron-loss calculation device according to embodiment 1.

FIG. 1 shows the configuration of a motor iron-loss calculation device according to embodiment 1.

As shown in FIG. 1, a motor iron-loss calculation device 1 receives a primary frequency ω of a motor, a q-axis current component iq (hereinafter, simply referred to as q-axis current iq, or as iq) which is torque current of the motor, and a d-axis current component id (hereinafter, simply referred to as d-axis current id, or as id) which is exciting current, and outputs an iron-loss value PIL. The d-axis and q-axis currents id and iq are currents in a dq-axis rotating coordinate system having the d axis in the rotor magnetic flux direction of the motor.

Figure 2:
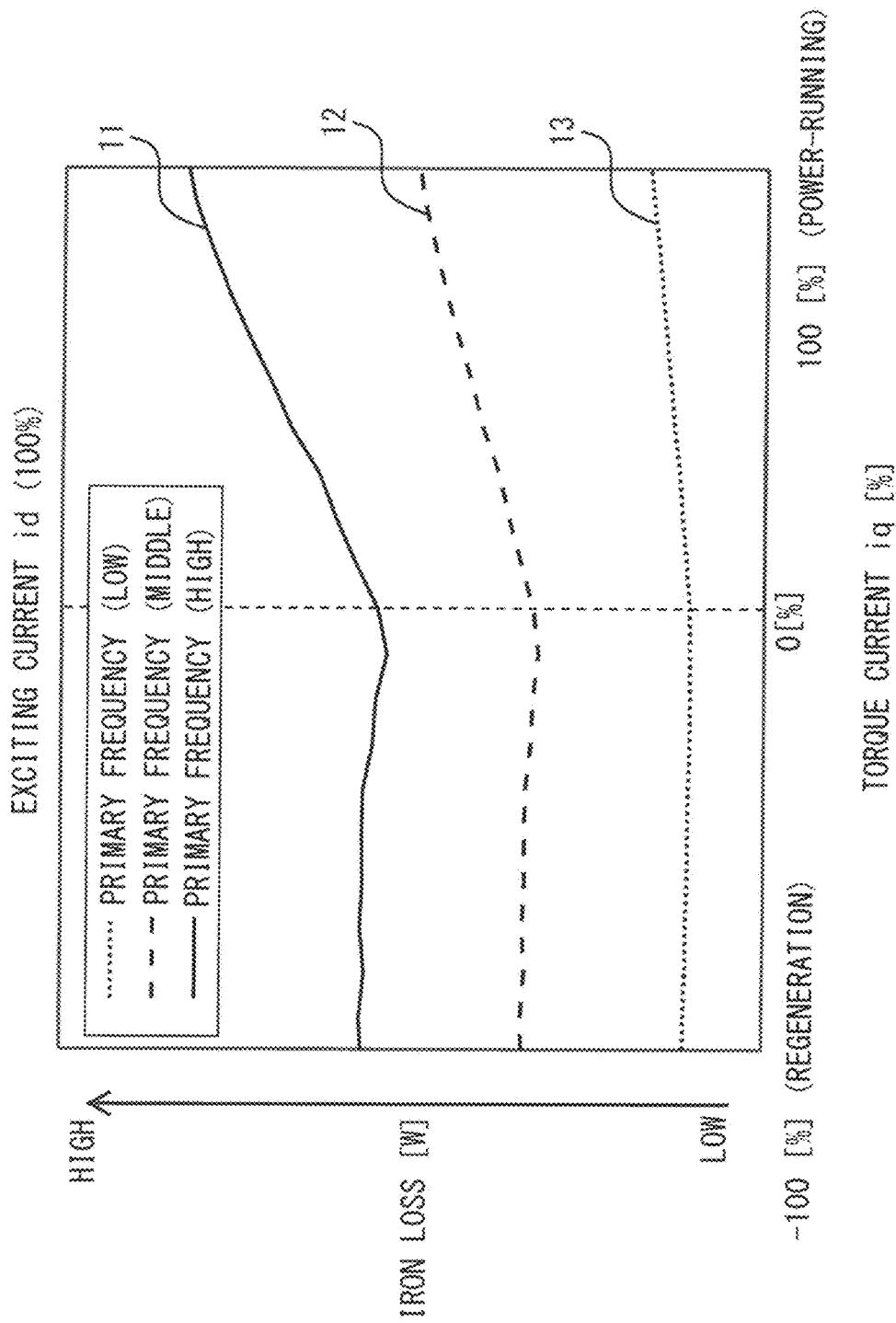
FIG. 2 shows an example of a measurement result for iron loss in accordance with torque current of a motor.

FIG. 2 shows an example of a measurement result for iron loss in accordance with torque current of the motor. This is a measurement result for iron loss in a case of using an induction motor. The vertical axis indicates the iron-loss value, and the horizontal axis indicates the q-axis current iq. Measurement results in several primary frequency conditions are shown together, and in this case, iron-loss waveforms 11, 12, 13 corresponding to three levels, i.e., high, middle, low, of the primary frequency ω are shown.

As shown in FIG. 2, iron loss changes in accordance with the primary frequency ω, and as the primary frequency ω increases, iron loss increases.

As described above, iron loss of a motor is roughly classified into two kinds, i.e., eddy current loss and hysteresis loss, and it is known that these are highly dependent on the frequency (primary frequency ω) of current or a magnetic flux at that time. In addition, change in iron loss in accordance with the primary frequency ω is significantly exhibited, and such tendency appears in the same manner for almost all motors.

Further, as shown in FIG. 2, iron loss nonlinearly varies in accordance with the q-axis current iq.

The inventors of the present disclosure have found that, as shown in FIG. 2, iron loss of the motor greatly changes in accordance with increase/decrease in the q-axis current iq, iron loss is uniquely determined by only the q-axis current iq under the condition in which the primary frequency is fixed, and further, iron loss differs between a power-running operation condition and a regenerative operation condition.

Figure 3:
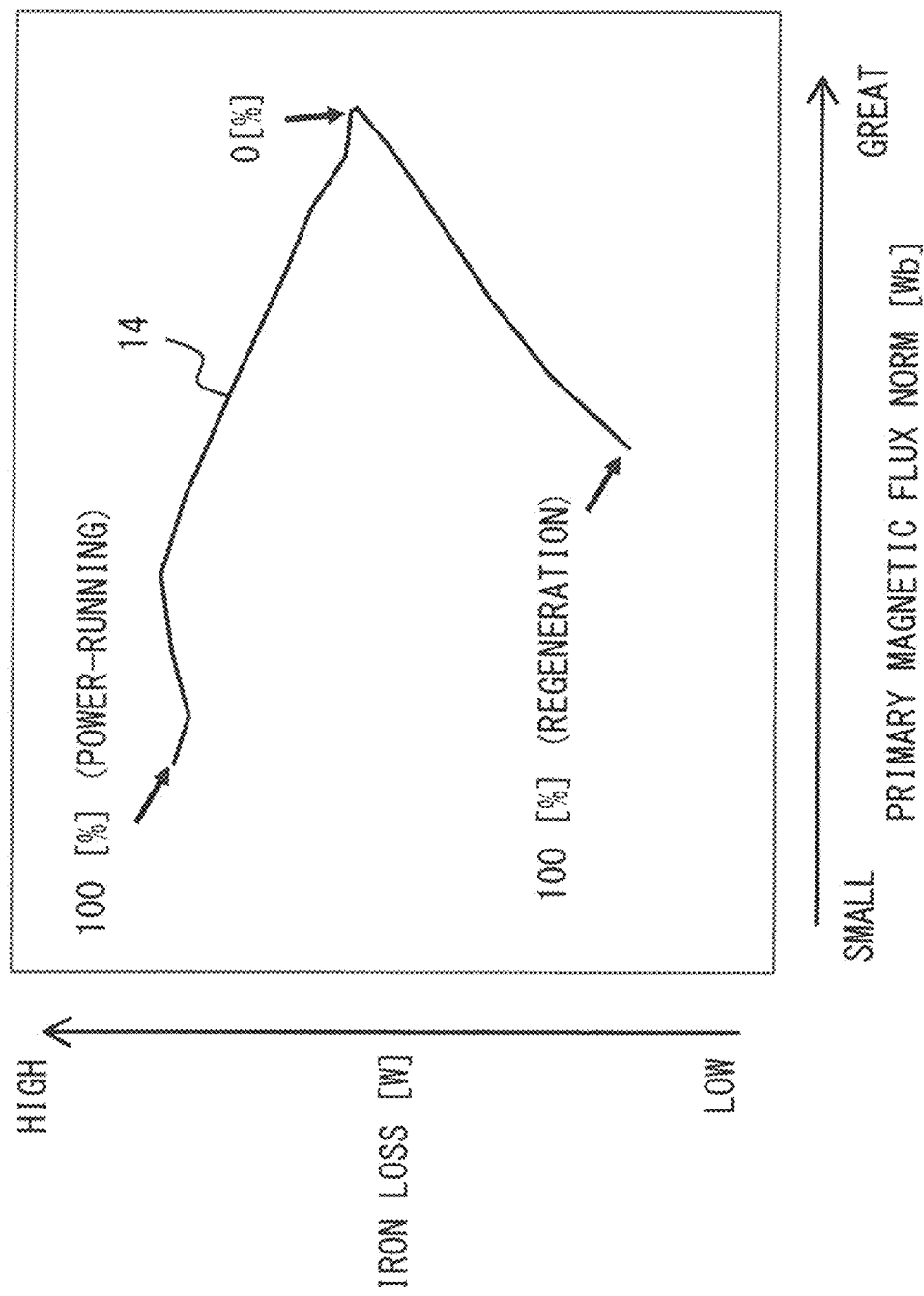
FIG. 3 is a reference graph showing an example of a measurement result for iron loss in accordance with a primary magnetic flux of a motor.

At the same time, the inventors have found that, as shown in FIG. 3, iron loss cannot be uniquely represented by only the norm of a stator magnetic flux (primary magnetic flux) under the condition in which the primary frequency is fixed. FIG. 3 is a reference graph showing an example of a measurement result for iron loss in accordance with the primary magnetic flux of the motor. Here, an iron loss waveform 14 in accordance with the primary magnetic flux norm is shown.

The motor iron-loss calculation device 1 according to the present embodiment calculates the iron-loss value PIL on the basis of the primary frequency ω and the q-axis current iq of the motor.

As shown in FIG. 1, the motor iron-loss calculation device 1 includes a coefficient conversion unit 2, a polynomial calculation unit 3, and a correction unit 4.

In the polynomial calculation unit 3, a polynomial function F(ω) having the primary frequency ω as a variable is set in advance. The polynomial calculation unit 3 receives coefficients A2, A1, A0 for respective terms of the polynomial function F(ω) and the primary frequency ω, and outputs a calculation result of the polynomial function F(ω). In this case, a quadratic function is used as the polynomial function F(ω), and exponentiation calculation units 3a, 3b, 3c for the respective terms calculate exponentiation to the power of 2, the power of 1, and the power of 0 (=1). Then, outputs of the exponentiation calculation units 3a, 3b, 3c are respectively multiplied by the coefficients A2, A1, A0 and added, and the sum of the three terms is outputted.

In this case, F(ω) is represented by the following Expression (1).

$$F(\omega) = A2 \cdot \omega^2 + A1 \cdot \omega + A0 \qquad (1)$$

The coefficient conversion unit 2 stores coefficient information 2a, 2b, 2c for each term of the polynomial function F(ω). The coefficient conversion unit 2 receives the q-axis current iq, refers to each coefficient information 2a, 2b, 2c, and outputs coefficients A2(iq), A1(iq), A0(iq) for the respective terms of the polynomial function F(ω). Here, A2(iq), A1(iq), A0(iq) are values of the respective coefficients A2, A1, A0 corresponding to the value of iq.

The polynomial calculation unit 3 substitutes the coefficients A2(iq), A1(iq), A0(iq) outputted from the coefficient conversion unit 2 and the primary frequency ω into the set F(ω), and outputs an iron-loss value PILα which is the calculation result. That is, PILα is represented by the following Expression (2).

$$PIL\alpha = A2(iq) \cdot \omega^2 + A1(iq) \cdot \omega + A0(iq) \qquad (2)$$

Here, each coefficient information 2a, 2b, 2c stored in the coefficient conversion unit 2 is generated for one set value of the d-axis current id, and is a function that associates one value of each coefficient A2, A1, AC with the q-axis current iq as an argument. The function of each coefficient information 2a, 2b, 2c is not limited to representation by a mathematical expression, and may be represented as a data table or a data map.

In this case, as the one set value of the d-axis current id, rated d-axis current idα at 100% is used, and under the condition of the d-axis current idα, measurement information of iron loss of a target motor is collected in advance to generate each coefficient information 2a, 2b, 2c, which is then stored in the coefficient conversion unit 2.

The iron-loss value PILα from the polynomial calculation unit 3 is inputted to the correction unit 4, and the correction unit 4 performs correction calculation for the iron-loss value PTLα in accordance with actual d-axis current id, thus outputting the iron-loss value PIL.

The coefficient conversion unit 2 will be described below in detail.

For the coefficient A2, A1, A0 of each coefficient information 2a, 2b, 2c, the data shape is determined highly depending on the characteristics of the motor. Meanwhile, in implementation of the coefficient conversion unit 2, if the calculation amount is reduced and the used storage capacity is reduced, size reduction and speed increase can be achieved. Therefore, each coefficient information 2a, 2b, 2c is selected as appropriate in accordance with the data shape of the coefficients A2, A1, A0 so that the calculation amount is reduced or the data capacity is reduced.

For example, the coefficient information 2c for outputting the coefficient A0 in the coefficient conversion unit 2 may be represented by the following polynomial expression (3) as an example, to calculate the coefficient A0 with the q-axis current iq inputted. In the following expression, D4, D3, D2, D1, and D0 are coefficients for respective terms.

$$A0(iq)=D4 \cdot iq^4+D3 \cdot iq^3+D2 \cdot iq^2+D1 \cdot iq+D0 \quad (3)$$

In this case, a quartic expression with respect to the q-axis current iq is used, but without limitation thereto, a mathematical expression combined with a trigonometric function or the like may be used.

Figure 4:
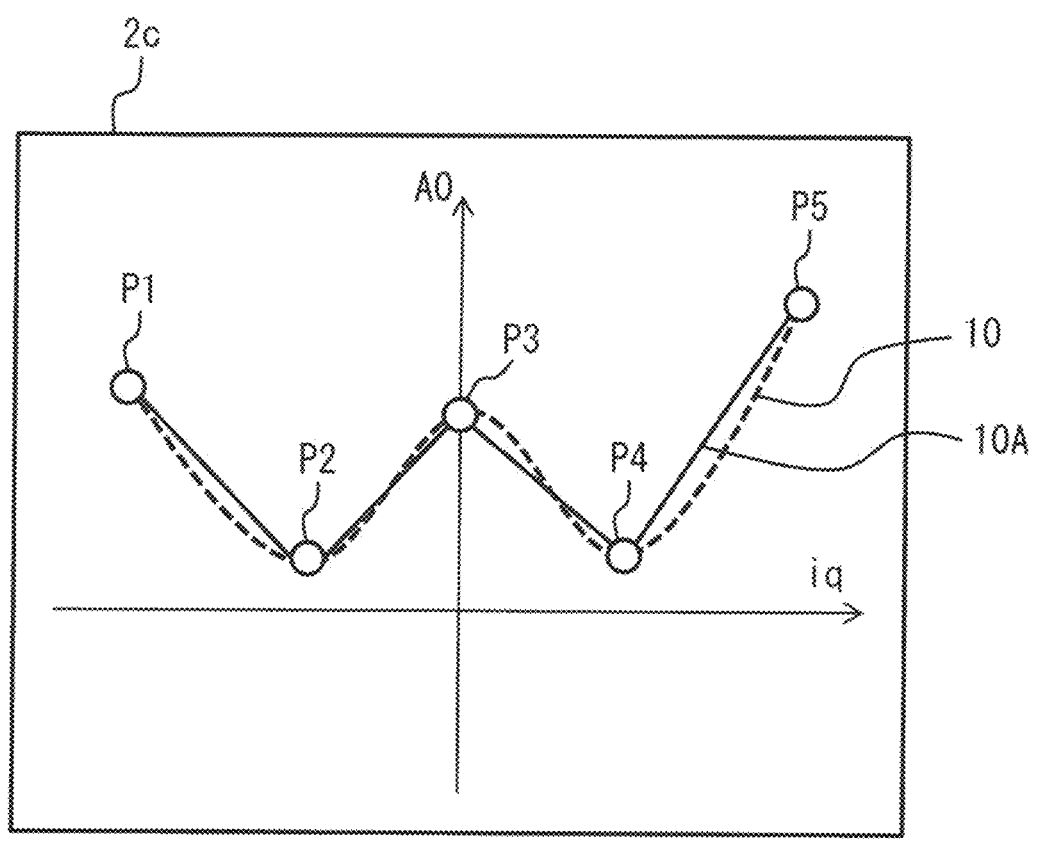
FIG. 4 illustrates linear interpolation in determining a coefficient by a coefficient conversion unit according to embodiment 1.

In a case where representation by such a mathematical expression is difficult, as shown in FIG. 4, the coefficient may be calculated using interpolation calculation. FIG. 4 illustrates linear interpolation in determining the coefficient by the coefficient conversion unit.

As shown in FIG. 4, data of A0 at a plurality of points P1, P2, P3, P4, P5 on the waveform 10 of the coefficient A0 are stored, calculation of linear interpolation is performed by a segment 10A connecting the points, and then A0 corresponding to the inputted value of q-axis current iq is outputted. In this case, an example of using linear interpolation is shown, but another processing such as spline interpolation may be used.

As described above, the configuration of each coefficient information 2a, 2b, 2c and the calculation method for the coefficients A2, A1, A0 are selected in consideration of the calculation amount, the storage capacity, and accuracy on the basis of iron-loss characteristics of the motor, and the like.

The data shape of the coefficient A2, A1, A0 in each coefficient information 2a, 2b, 2c shown in FIG. 1 is merely an example for explanation, and the data shape is not limited thereto.

In the present embodiment, the polynomial function $F(\omega)$ is a quadratic function and three coefficients A2, A1, A0 are used. However, the polynomial function $F(\omega)$ is not limited to a quadratic function, and may be a linear function or a polynomial function of third or higher order. In this case, the number of the exponentiation calculation units 3a, 3b, 3c and the number of pieces of coefficient information 2a, 2b, 2c stored in the coefficient conversion unit 2 also change in accordance with the order.

Next, operation of the correction unit 4 will be described.

Figure 5:
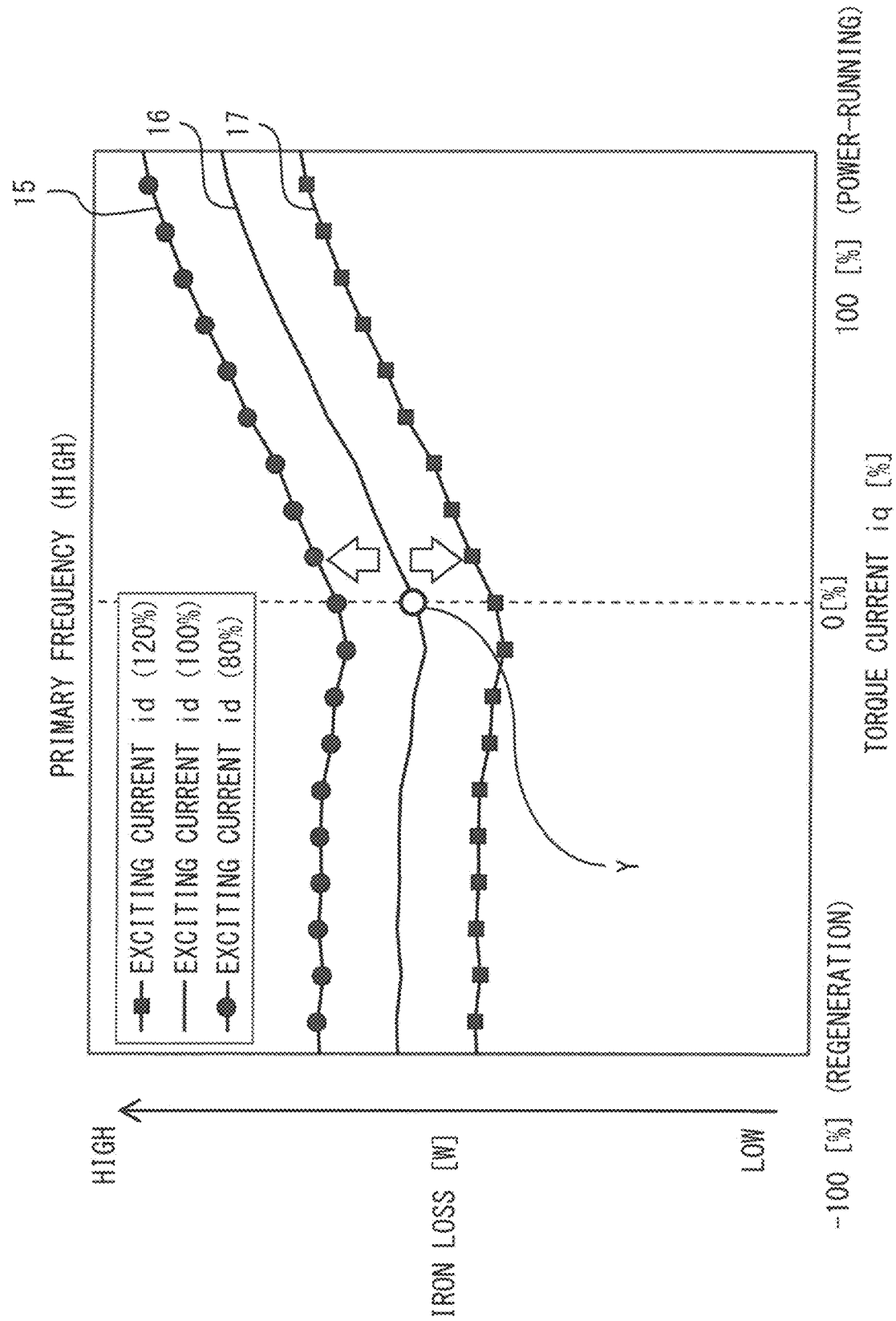
FIG. 5 shows an example of a measurement result for iron loss in accordance with torque current of a motor.

FIG. 5 shows an example of a measurement result for iron loss in accordance with torque current of the motor. This is a measurement result for iron loss in the case of using the same induction motor as described in FIG. 2. The vertical axis indicates the iron-loss value, and the horizontal axis indicates the q-axis current iq. In this case, measurement results obtained while the d-axis current id is changed under the condition of the primary frequency (high) in FIG. 2, are shown. Here, iron loss waveforms 15, 16, 17 corresponding to three levels, i.e., 80%, 100%, 120%, of the d-axis current id are shown. The waveform 16 corresponds to the waveform 11 in FIG. 2.

The inventors of the present disclosure have found that, as shown in FIG. 5, when the d-axis current id is changed, iron loss changes so as to slide in accordance with increase/decrease in the d-axis current id while the data shape of iron loss with respect to the q-axis current iq is generally maintained. That is, the change width of iron loss changing in accordance with increase/decrease in the d-axis current id hardly changes by the q-axis current iq. This fact is used for correction calculation in the correction unit 4.

The correction unit 4 calculates the change width ΔPIL when the q-axis current iq is 0%, and adds the change width ΔPIL to the iron-loss value PILα which is the calculation result of the polynomial calculation unit 3, to generate the iron-loss value PIL.

That is, the iron-loss value PIL generated by the motor iron-loss calculation device 1 is represented by the following Expression (4).

$$PIL=PIL\alpha+\Delta PIL \quad (4)$$

As described above, each coefficient information 2a, 2b, 2c is generated for one set value of the d-axis current id, i.e., under the condition of the rated d-axis current idα at 100%. Therefore, the iron-loss value PILα which is the calculation result of the polynomial calculation unit 3 is also a value under the condition of the d-axis current idα.

The change width ΔPIL of iron loss when the d-axis current id changes from idα (100%) to actual id is calculated by the following Expression (5).

$$\Delta PIL=(PIL\alpha 0/id\alpha) \cdot (id-id\alpha) \quad (5)$$

Here, PILα0 is iron loss at a point Y for the condition of idα (100%) and iq (0%), i.e., the iron-loss value PILα at iq (0%), and is represented by the following Expression (6) on the basis of the above Expression (2), $$PIL\alpha 0=A2(0) \cdot \omega^2+A1(0) \cdot \omega+A0(0) \quad (6)$$

Thus, by providing the correction unit 4 which performs correction calculation on the basis of the d-axis current id, it suffices that each coefficient information 2a, 2b, 2c is generated and stored for one set value of the d-axis current id, so that the number of conditions is decreased and the data capacity needed for iron-loss calculation can be reduced.

In the correction calculation using the above Expressions (4) to (6), when id is equal to idα (100%), no correction is performed, so that the iron-loss value PILα inputted to the correction unit 4 is directly outputted as the iron-loss value PIL. In addition, when id and iq are equal to 0, the iron-loss value PIL outputted from the correction unit 4 becomes 0.

The motor iron-loss calculation device 1 according to embodiment 1 calculates the iron-loss value PIL of the motor on the basis of the primary frequency ω and the q-axis current iq of the motor. Thus, by sequentially performing calculation while inputting the q-axis current iq which sequentially changes with the operation state of the motor (load state) to the motor iron-loss calculation device 1, iron loss which changes in accordance with the operation state of the motor (load state) can be accurately calculated.

The motor iron-loss calculation device 1 includes the polynomial calculation unit 3 in which the polynomial function $F(\omega)$ having the primary frequency ω as a variable is set in advance, and the coefficient conversion unit 2 in which the coefficient information 2a, 2b, 2c for each term of the polynomial function $F(\omega)$ is stored, and which receives the q-axis current iq and outputs the coefficient A2, A1, A0 for each term of the polynomial function F(ω). The polynomial calculation unit 3 substitutes the coefficients A2, A1, A0 outputted from the coefficient conversion unit 2 and the primary frequency ω into the polynomial function F(ω), and outputs the iron-loss value PILα.

In this way, the motor iron-loss calculation device 1 performs approximate representation for iron loss of the motor using the polynomial function F(ω) and the coefficients A2, A1, A0. Then, on the basis of the approximate representation, the motor iron-loss calculation device 1 performs calculation for estimating the iron-loss value PILα, and outputs the iron-loss value PILα.

Thus, it is possible to easily and assuredly calculate an accurate iron-loss value PILα, with only inputs of the primary frequency ω and the q-axis current iq.

The coefficient information 2a, 2b, 2c stored for each term of the polynomial function F(ω) in the coefficient conversion unit 2 is generated for one set value idα (100%) of the d-axis current id, and is a function that associates one coefficient with respect to each value of the q-axis current iq. Then, the iron-loss value PIL-a which is the calculation result of the polynomial function F(ω) is corrected in accordance with the actual d-axis current id.

Thus, the calculation amount and the data capacity of the motor iron-loss calculation device 1 can be both reduced, whereby size reduction and speed increase can be achieved and an inexpensive device configuration can be provided.

Figure 6:
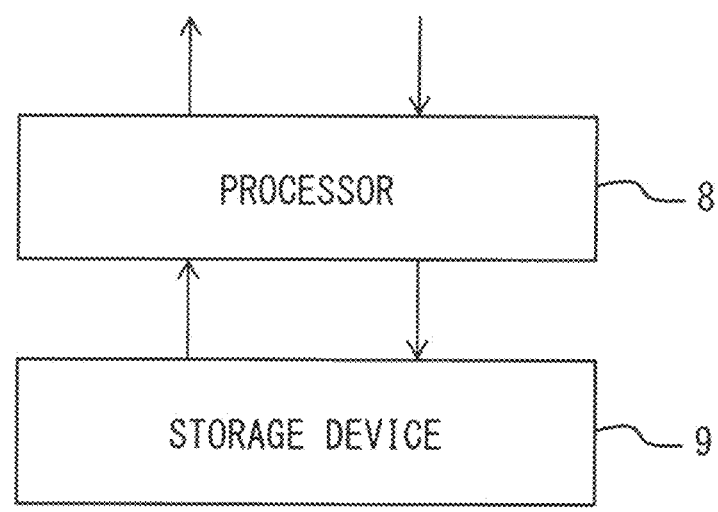
FIG. 6 shows an example of the hardware configuration of the motor iron-loss calculation device according to embodiment 1.

As hardware implementing the motor iron-loss calculation device 1, for example, a processor 8 and a storage device 9 shown in FIG. 6 may be used in combination.

The processor 8 executes a control program inputted from the storage device 9. The storage device 9 includes an auxiliary storage device and a volatile storage device. The control program is inputted from the auxiliary storage device to the processor 8 via the volatile storage device. The processor 8 outputs data such as a calculation result to the volatile storage device of the storage device 9, and stores such data into the auxiliary storage device via the volatile storage device as necessary.

Embodiment 2

Figure 7:
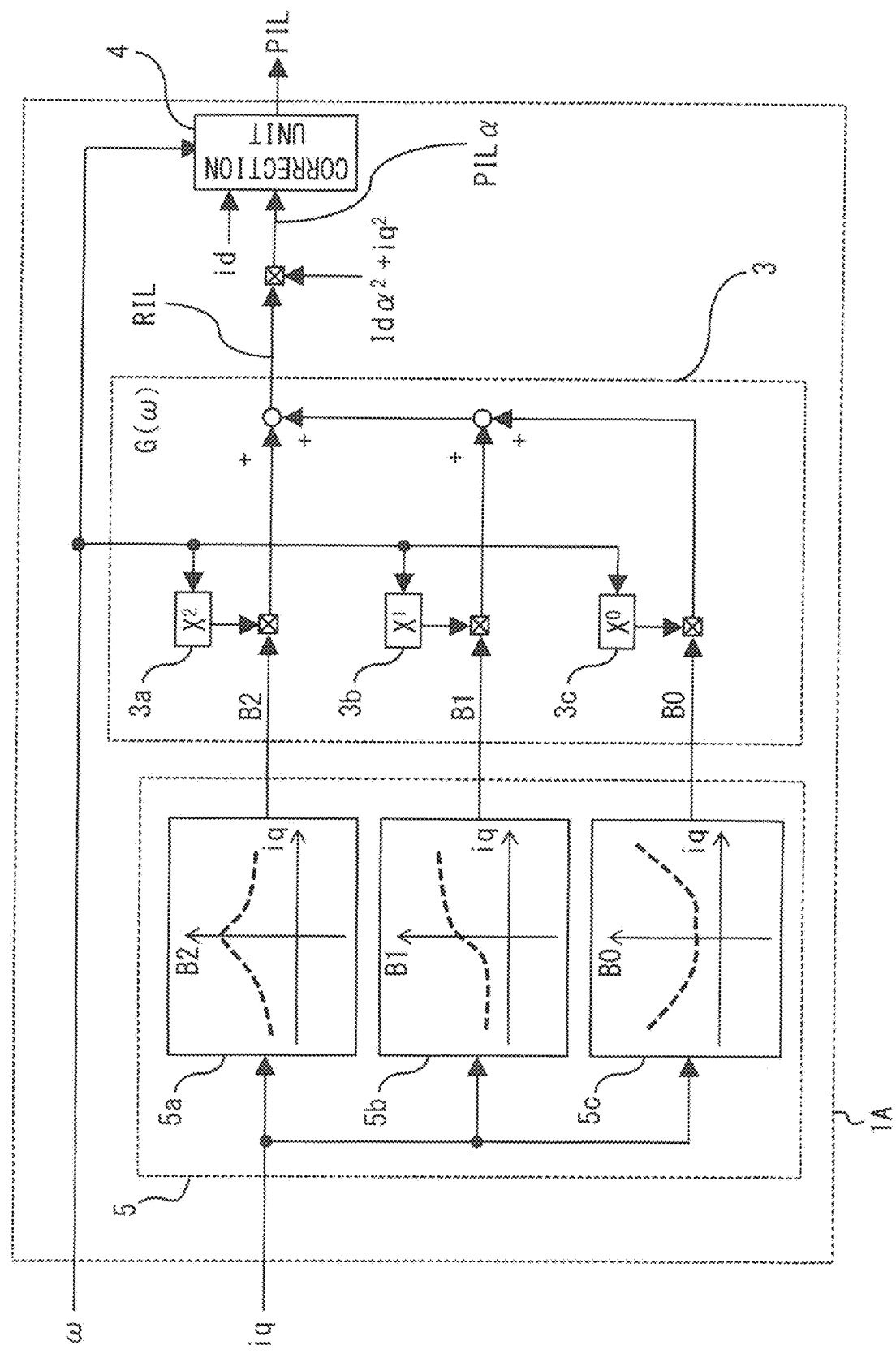
FIG. 7 shows the configuration of a motor iron-loss calculation device according to embodiment 2.

FIG. 7 shows the configuration of a motor iron-loss calculation device according to embodiment 2.

As shown in FIG. 7, a motor iron-loss calculation device 1A receives the primary frequency ω of the motor, the q-axis current iq which is torque current of the motor, and the d-axis current id which is exciting current, and outputs the iron-loss value PIL.

The motor iron-loss calculation device 1A according to embodiment 2 calculates an iron-loss resistance RIL on the basis of the primary frequency co and the q-axis current iq of the motor. In this case, iron loss is represented by power loss due to the iron-loss resistance, and the iron-loss resistance is calculated by dividing the iron loss by a current vector norm to the power of 2 (id^2+iq^2).

Then, the iron-loss value PILα is generated from the iron-loss resistance RIL, and thereafter, as in the above embodiment 1, the correction unit 4 performs correction calculation for the iron-loss value PILα on the basis of the d-axis current id, and outputs the iron-loss value PIL.

Figure 8:
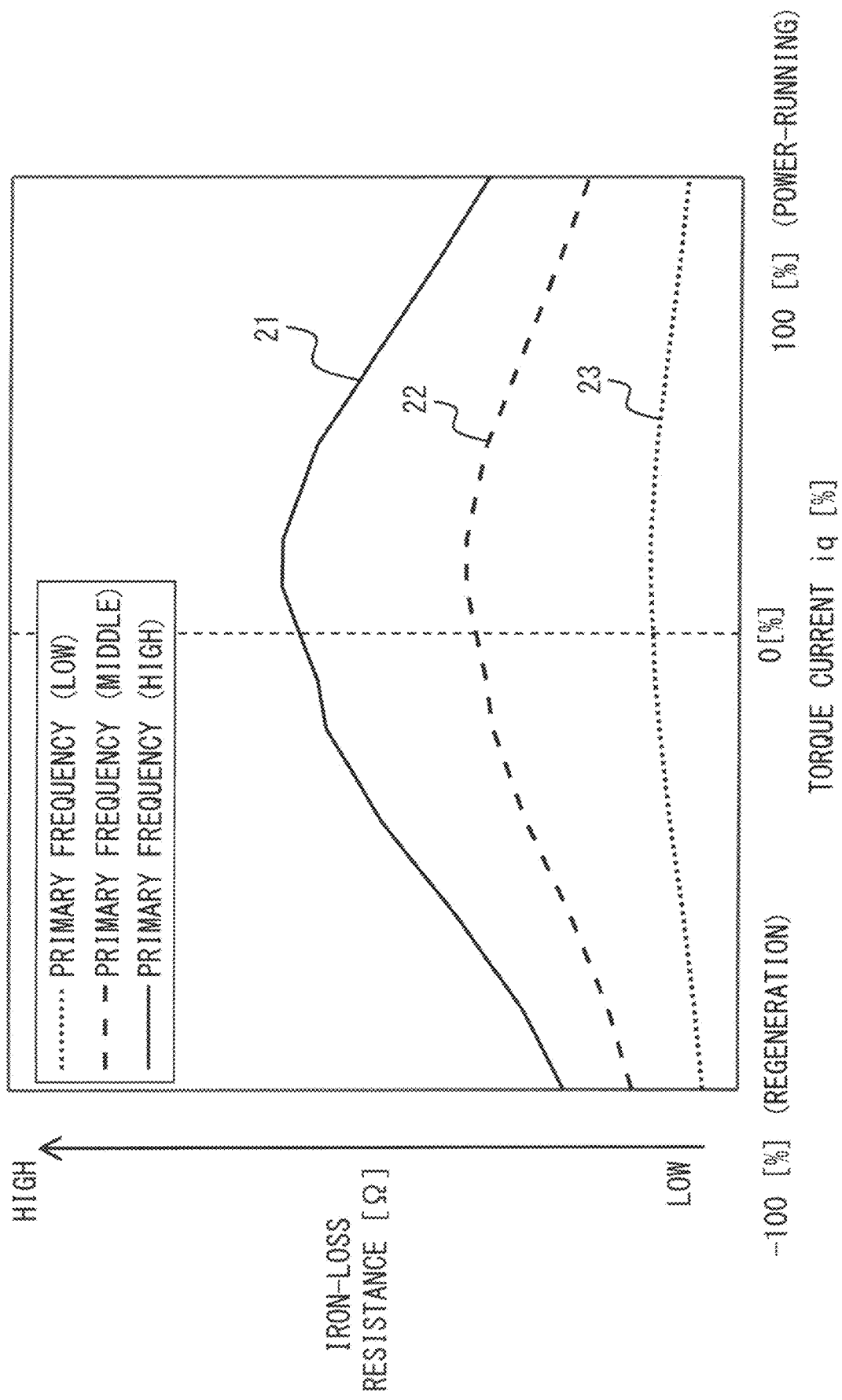
FIG. 8 shows an example of an iron-loss resistance in accordance with torque current of a motor.

FIG. 8 shows an example of the iron-loss resistance in accordance with torque current of the motor. In this case, the iron loss shown in FIG. 2 in the above embodiment 1 is divided by the current vector norm to the power of 2 (id^2+iq^2), so as to be converted to the iron-loss resistance.

Here, iron-loss resistance waveforms 21, 22, 23 corresponding to three levels, i.e., high, middle, low, of the primary frequency ω are shown. The iron-loss resistance waveforms 21, 22, 23 respectively correspond to the iron loss waveforms 11, 12, 13 in FIG. 2.

As shown in FIG. 8, the iron-loss resistance increases in accordance with increase in the primary frequency ω, and has a shape changing in accordance with the torque current iq, and the iron-loss resistance is uniquely determined by only the q-axis current iq under the condition in which the primary frequency is fixed. In addition, the value differs between the power-running condition and the regenerative condition, and the peak of the iron-loss resistance is slightly shifted to the power-running side. Thus, the shape is asymmetric with respect to the torque current iq.

Figure 9:
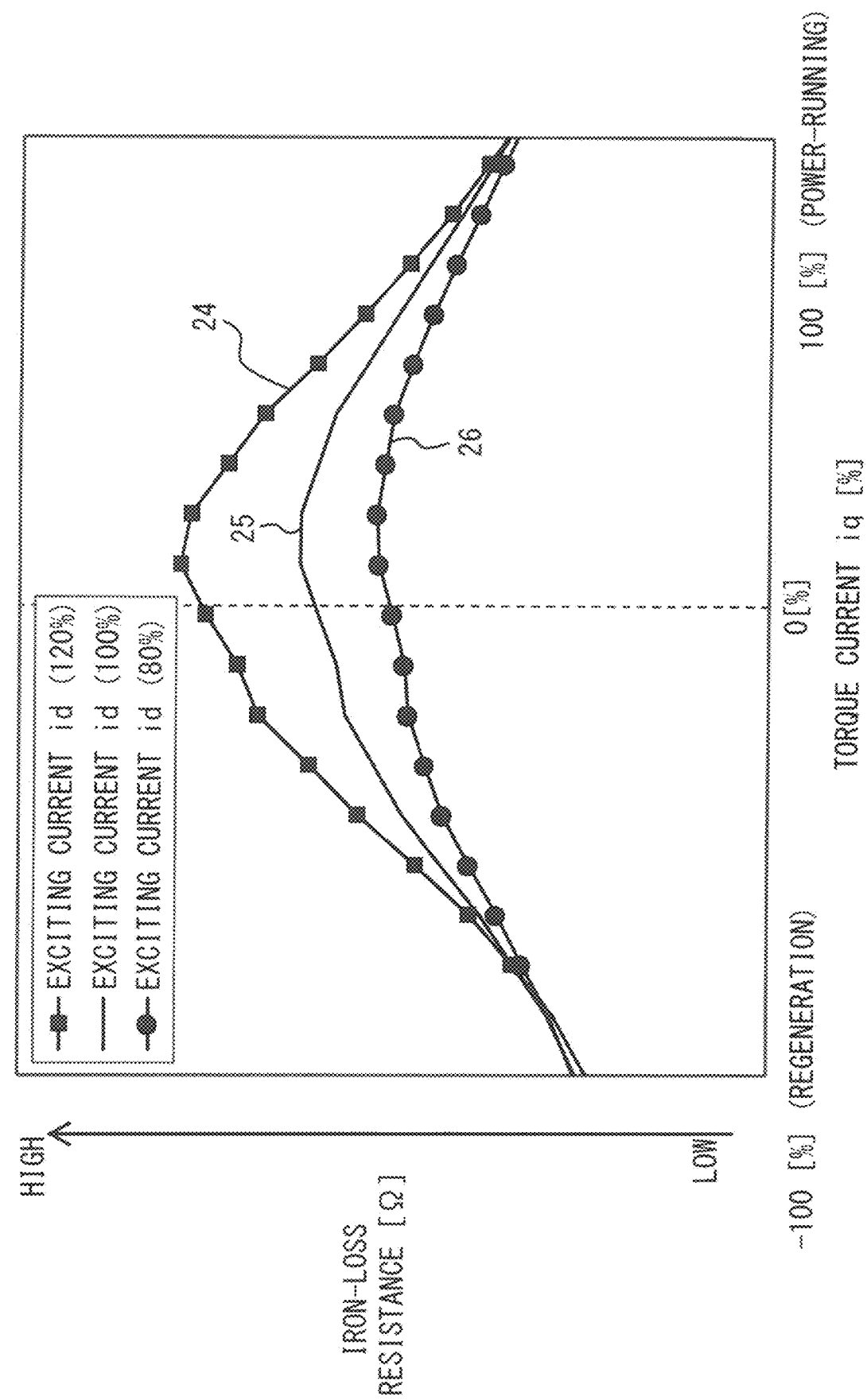
FIG. 9 shows an example of an iron-loss resistance in accordance with torque current of a motor.

FIG. 9 shows an example of the iron-loss resistance in accordance with torque current of the motor. In this case, the iron loss shown in FIG. 5 in the above embodiment 1 is divided by the current vector norm to the power of 2 (id^2+iq^2), so as to be converted to the iron-loss resistance. Here, iron-loss resistance waveforms 26, 25, 24 corresponding to three levels, i.e., 80%, 100%, 120%, of the d-axis current id are shown. The waveform 25 corresponds to the waveform 21 in FIG. 8.

In the polynomial calculation unit 3, a polynomial function G(ω) having the primary frequency ω as a variable is set in advance, as in the above embodiment 1. The polynomial calculation unit 3 receives coefficients B2, B1, B0 for respective terms of the polynomial function G(ω) and the primary frequency ω, and outputs a calculation result of the polynomial function G(ω). In this case, a quadratic function is used as the polynomial function G(ω), and the exponentiation calculation units 3a, 3b, 3c for the respective terms calculate exponentiation to the power of 2, the power of 1, and the power of 0 (=1). Then, outputs of the exponentiation calculation units 3a, 3b, 3c are respectively multiplied by the coefficients B2, B1, B0 and added, and the sum of the three terms is outputted.

In this case, G(ω) is represented by the following Expression (7).

$$G(\omega) = B2 \cdot \omega^2 + B1 \cdot \omega + B0 \quad (7)$$

A coefficient conversion unit 5 stores coefficient information 5a, 5b, 5c for each term of the polynomial function G(ω). The coefficient conversion unit 5 receives the q-axis current iq, refers to each coefficient information 5a, 5b, 5c, and outputs coefficients B2(iq), B1(iq), B0(iq) for the respective terms of the polynomial function G(ω). Here, B2(iq), B1(iq), B0(iq) are values of the respective coefficients B2, B1, B0 corresponding to the value of iq.

The polynomial calculation unit 3 substitutes the coefficients B2(iq), B1(iq), B0(iq) outputted from the coefficient conversion unit 5 and the primary frequency W into the set G(ω), and outputs the iron-loss resistance RIL which is the calculation result. That is, RIL is represented by the following Expression (8).

$$RIL = B2(iq) \cdot \omega^2 + B1(iq) \cdot \omega + B0(iq) \quad (8)$$

As in the above embodiment 1, each coefficient information Sa, Sb, Sc stored in the coefficient conversion unit 5 is generated for one set value of the d-axis current id, and is a function that associates one value of each coefficient B2, B1, BC with the q-axis current iq as an argument. The function of each coefficient information 5a, 5b, 5c is not limited to representation by a mathematical expression, and may be represented as a data table or a data map.

Also in this case, as the one set value of the d-axis current id, the rated d-axis current idα at 100% is used, and under the condition of the d-axis current idα, information of iron-loss resistance values based on measurement values of iron loss of a target motor is collected in advance to generate each coefficient information 5a, 5b, 5c, which is then stored in the coefficient conversion unit 5.

The motor iron-loss calculation device 1A multiplies the iron-loss resistance RIL which is the calculation result of the polynomial calculation unit 3 by the current vector norm to the power of 2 at the rated d-axis current idα (idα^2+iq^2), to generate the iron-loss value PILα. That is, the iron-loss value PILα is represented by the following Expression (9).

$$PIL\alpha = RIL \cdot (id\alpha^2 + iq^2) \quad (9)$$

As in the above embodiment 1, the correction unit 4 calculates the change width ΔPIL when the q-axis current iq is 0%, and adds the change width ΔPIL to the iron-loss value PILα, to generate the iron-loss value PIL.

That is, the iron-loss value PIL generated by the motor iron-loss calculation device 1 is represented by the following Expression (10).

$$PIL = PIL\alpha + \Delta PIL \quad (10)$$
$$= PIL\alpha + (PIL\alpha 0 / id\alpha) \cdot (id - id\alpha)$$

Here, PILα0 is iron loss at the point Y (see FIG. 5) for the condition of idα (100%) and iq (0%), i.e., the iron-loss value PILα at iq (0%), and is represented by the following Expression (11) on the basis of the above Expressions (8) and (9).

$$PIL\alpha 0 = (B2(0) \cdot \omega^2 + B1(0) \cdot \omega + B0(0)) \cdot (id\alpha^2) \quad (11)$$

As described above, the motor iron-loss calculation device 1A according to embodiment 2 calculates the iron-loss resistance RIL on the basis of the primary frequency ω and the q-axis current iq which sequentially changes with the operation state of the motor (load state), and calculates the iron-loss value PIL on the basis of the iron-loss resistance RIL. Thus, iron loss which changes in accordance with the operation state of the motor can be accurately calculated.

The motor iron-loss calculation device 1A includes the polynomial calculation unit 3 in which the polynomial function G(ω) having the primary frequency ω as a variable is set in advance, and the coefficient conversion unit 5 which receives the q-axis current iq and outputs the coefficient B2, B1, B0 for each term of the polynomial function G(ω), thereby calculating the iron-loss resistance RIL.

In this way, the motor iron-loss calculation device 1A performs approximate representation for the iron-loss resistance of the motor using the polynomial function G(ω) and the coefficients B2, B1, B0. Then, on the basis of the approximate representation, the motor iron-loss calculation device 1A performs calculation for estimating the iron-loss resistance RIL, and outputs the iron-loss resistance RIL.

Thus, it is possible to easily and assuredly calculate an accurate iron-loss resistance RIL, with only inputs of the primary frequency ω and the q-axis current iq.

The coefficient information 5a, 5b, 5c stored for each term of the polynomial function G(ω) in the coefficient conversion unit 5 is generated for one set value idα (100%) of the d-axis current id, and is a function that associates one coefficient with respect to each value of the q-axis current iq. Then, the iron loss PILα based on the iron-loss resistance RIL which is the calculation result of the polynomial function G(ω) is corrected in accordance with the actual d-axis current id.

Thus, the calculation amount and the data capacity of the motor iron-loss calculation device 1A can be both reduced, whereby size reduction and speed increase can be achieved and an inexpensive device configuration can be provided.

In the above embodiment 2, iron loss is represented by power loss due to the iron-loss resistance. In this case, under the set condition of the d-axis current id, information of iron-loss resistances of a target motor is collected in advance to generate each coefficient information 5a, 5b, 5c of the coefficient conversion unit 5. Depending on the motor type, using the iron-loss resistance leads to reduction of the order of the polynomial function G(ω) or the function of each coefficient information 5a, 5b, 5c, whereby an accurate calculation result (RIL) can be obtained. Thus, the calculation amount and the data capacity of the motor iron-loss calculation device 1A can be further reduced, whereby further size reduction and speed increase can be achieved.

Further, in a case where the calculated iron loss PIL is used for torque control of the motor, depending on the type or the operation condition of the motor, accuracy of control calculation is improved through calculation using the value of the iron-loss resistance RIL.

Since iron loss is represented by power loss due to the iron-loss resistance, the iron-loss value becomes zero under the condition in which the current is zero. Therefore, the above configuration cannot be applied to iron-loss calculation of a permanent magnet motor in which iron loss due to a magnet magnetic flux occurs even when the current is zero.

Embodiment 3

Figure 10:
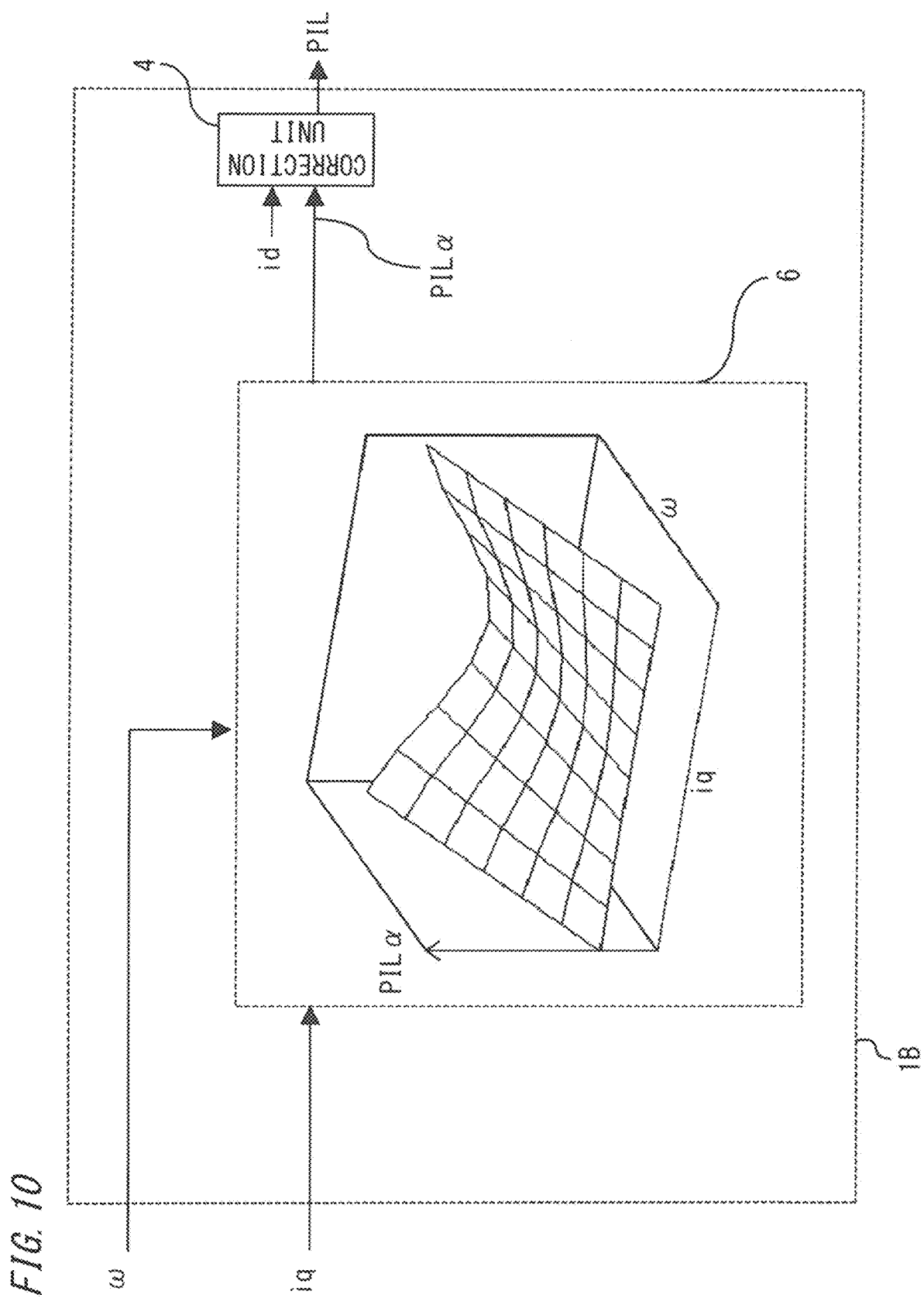
FIG. 10 shows the configuration of a motor iron-loss calculation device according to embodiment 3.

FIG. 10 shows the configuration of a motor iron-loss calculation device according to embodiment 3.

As shown in FIG. 10, a motor iron-loss calculation device 1B receives the primary frequency ω of the motor, the q-axis current iq which is torque current of the motor, and the d-axis current id which is exciting current, and outputs the iron-loss value PIL.

In the above embodiments 1 and 2, the iron loss PIL is calculated on the basis of approximate representation using the polynomial function F(ω), G(ω) of the primary frequency ω and the coefficients, whereas in embodiment 3, the iron loss PIL is calculated using a function having the primary frequency ω and the q-axis current iq as two variables.

As shown in FIG. 10, the motor iron-loss calculation device 1B includes a function calculation unit 6 and the correction unit 4.

In the function calculation unit 6, a function having the primary frequency ω and the q-axis current iq as two variables is set in advance and stored. The function calculation unit 6 receives the primary frequency ω and the q-axis current iq, and outputs the iron-loss value PILα which is the calculation result of the function.

Here, the function stored in the function calculation unit 6 is generated for one set value of the d-axis current id, and is a function that associates one iron-loss value PILα with respect to each combination of the primary frequency ω and the q-axis current iq. This function is information represented by a two-dimensional data map, a two-dimensional data table, or the like.

The data shape in the function calculation unit 6 shown in FIG. 10 is merely an example.

Figure 11:
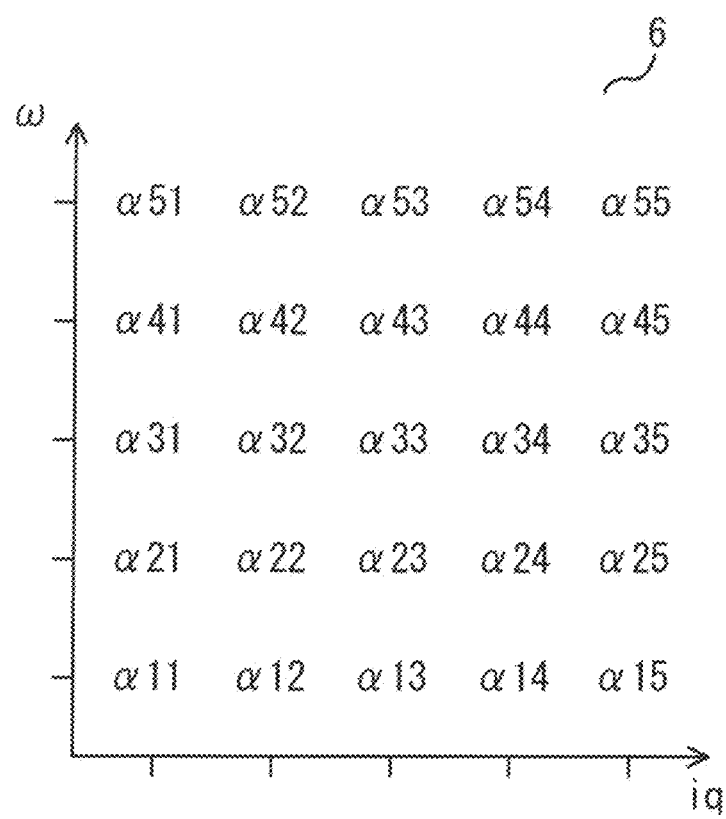
FIG. 11 illustrates stored information of a function calculation unit according to embodiment 3.

FIG. 11 illustrates the stored information of the function calculation unit 6 and shows a two-dimensional data table. One iron-loss value ($\alpha 11$ to $\alpha 55$) is associated with respect to each combination of the primary frequency $\omega$ and the q-axis current iq.

In this case, as the one set value of the d-axis current id, the rated d-axis current id$\alpha$ at 100% is used, and under the condition of the d-axis current id$\alpha$, measurement information of iron loss of a target motor is collected in advance to generate the function, which is then stored in the function calculation unit 6.

Figure 12:
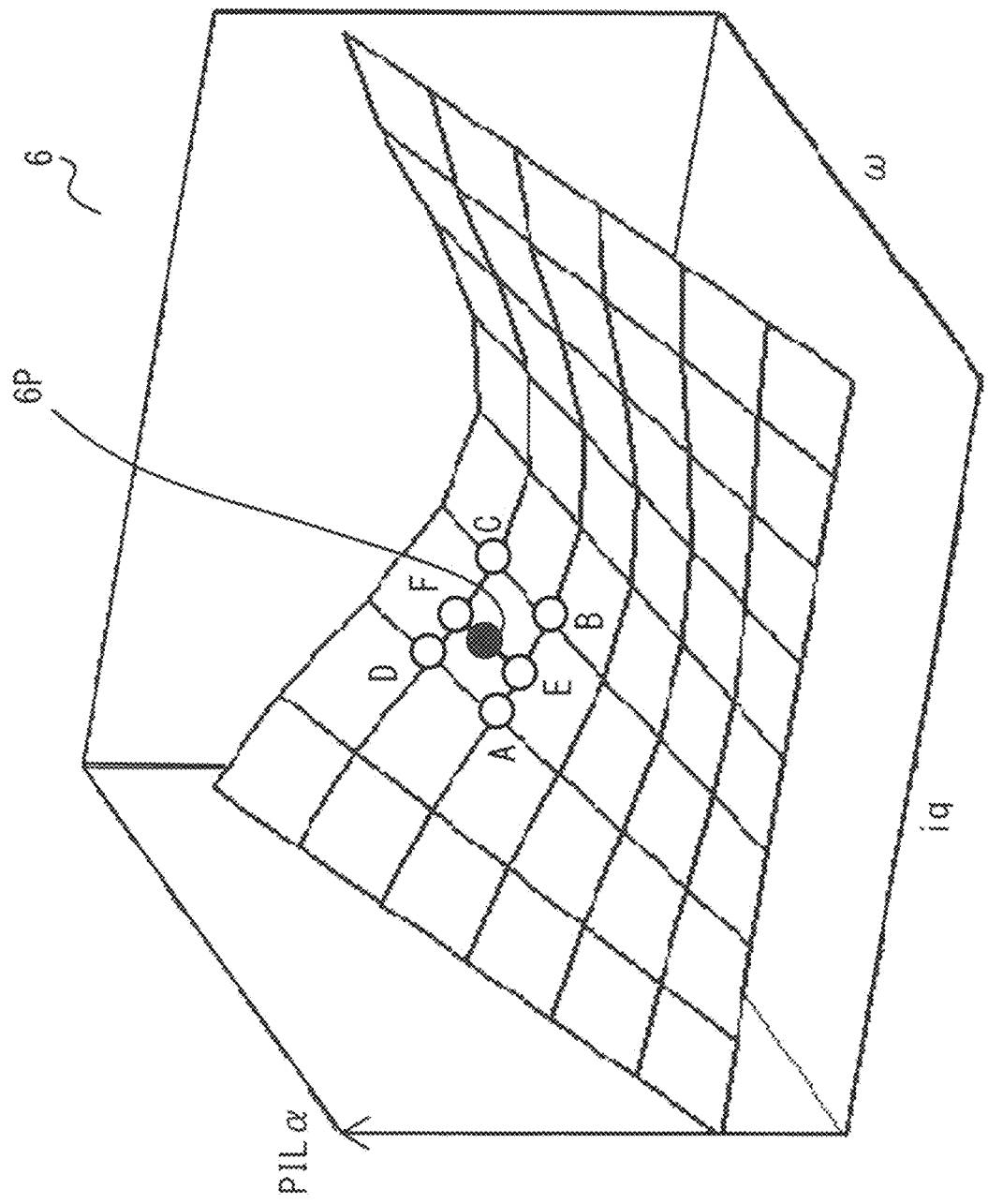
FIG. 12 illustrates linear interpolation in the function calculation unit according to embodiment 3.

As in the above embodiment 1, interpolation calculation may be used. An example of linear interpolation will be described below. FIG. 12 illustrates linear interpolation in the function calculation unit 6.

As shown in FIG. 12, the iron-loss value based on each combination of the primary frequency $\omega$ and the q-axis current iq is data at each lattice point (intersection). In a case of calculating an iron-loss value at a point 6P, data at four points A, B, C, D around the point 6P are extracted, and for example, calculation is performed as follows. First, linear interpolation is performed on a line connecting the points A and B, to calculate an iron-loss value at a point E corresponding to data at the same value of iq as the point 6P. Next, linear interpolation is performed on a line connecting the points C and D, to calculate a point F corresponding to data at the same value of iq as the point 6P. Then, linear interpolation is performed on a line connecting the point E and the point F, to calculate data at the same value of $\omega$ as the point 6P, i.e., the iron-loss value at the point 6P.

Here, linear interpolation has been used as an example, but another interpolation method may be used.

As described above, the configuration of information stored as the function in the function calculation unit 6 and the calculation method thereof are selected in consideration of the calculation amount, the storage capacity, and accuracy on the basis of iron-loss characteristics of the motor, and the like.

As in the above embodiment 1, the correction unit 4 calculates the change width $\Delta$PIL when the q-axis current iq is 0%, and adds the change width $\Delta$PIL to the iron-loss value PIL$\alpha$, to generate the iron-loss value PIL.

That is, the iron-loss value PIL generated by the motor iron-loss calculation device 1 is represented by the following Expression (12).

$$PIL = PIL\alpha + \Delta PIL \quad (12)$$
$$= PIL\alpha + (PIL\alpha 0 / id\alpha) \cdot (id - id\alpha)$$

Here, PIL$\alpha$0 is iron loss at the point Y (see FIG. 5) for the condition of id$\alpha$ (100%) and iq (0%), i.e., the iron-loss value PIL$\alpha$ at iq (0%), and is calculated by the function calculation unit 6.

As described above, the motor iron-loss calculation device 1B according to embodiment 3 calculates the iron-loss value PIL on the basis of the primary frequency $\omega$ and the q-axis current iq which sequentially changes with the operation state of the motor (load state). Thus, as in the above embodiment 1, iron loss which changes in accordance with the operation state of the motor can be accurately calculated.

In addition, the function calculation unit 6 in which the function having the primary frequency $\omega$ and the q-axis current iq as two variables is set in advance and stored, is provided to output the iron-loss value PIL$\alpha$.

Thus, the motor iron-loss calculation device 1B performs calculation for estimating the iron-loss value PIL$\alpha$ by approximating iron loss of the motor using information stored as the function in the function calculation unit 6, and outputs the iron-loss value PIL$\alpha$.

Thus, it is possible to easily and assuredly calculate an accurate iron-loss value PIL$\alpha$, with only inputs of the primary frequency $\omega$ and the q-axis current iq.

The information stored as the function in the function calculation unit 6 is generated for one set value id$\alpha$ (100%) of the d-axis current id, and is a function that associates one coefficient with respect to each value of the q-axis current iq. Then, the iron-loss value PIL$\alpha$ which is the calculation result of the function calculation unit 6 is corrected in accordance with the actual d-axis current id.

Thus, the calculation amount and the data capacity of the motor iron-loss calculation device 1B can be both reduced, whereby size reduction and speed increase can be achieved and an inexpensive device configuration can be provided.

Depending on the type or the current condition of the motor, iron loss or an iron-loss resistance of the motor changes complicatedly, and in particular, is influenced by magnetic flux saturation and the influence is great under a large-current condition.

In such a case, in approximate representation using the polynomial function $F(\omega)$, $G(\omega)$ of the primary frequency $\omega$ and the coefficients as in the above embodiments 1 and 2, increase in the order of the polynomial function and coefficient information might be required for ensuring calculation accuracy, resulting in increase in the calculation amount and the data capacity. In addition, for ensuring accuracy of exponentiation calculation of the primary frequency $\omega$, the following concern arises. When the order of the exponentiation increases, values to be treated become excessively great, and on the other hand, coefficients for exponentiation terms tend to become extremely small. Therefore, implementation needs to be performed with adequate consideration, in particular, in a case of using a fixed-point number microcomputer.

In embodiment 3, the concern as described above does not arise, and iron loss is calculated using the function represented by a two-dimensional data map, a two-dimensional data table, or the like. Accordingly, the number of data pieces to be stored is decreased and interpolation calculation such as linear interpolation is used, whereby an effect of both reducing the data capacity and ensuring accuracy of iron-loss calculation in a well-balanced manner is obtained.

Also in embodiment 3, as in the above embodiment 2, the iron-loss resistance RIL may be calculated and the iron-loss value PIL$\alpha$ may be generated from the iron-loss resistance RIL. This will be described below with reference to FIG. 13.

Figure 13:
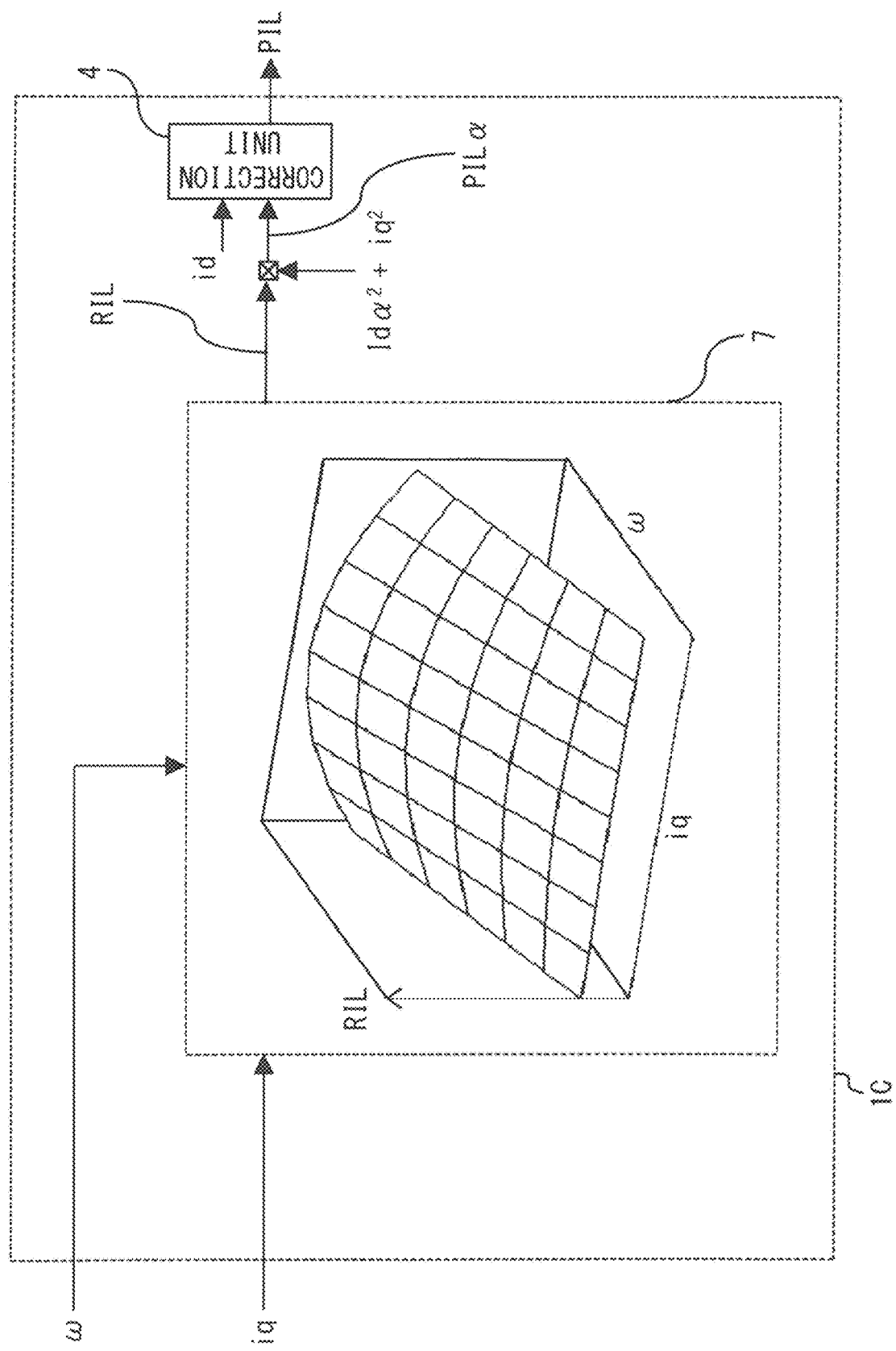
FIG. 13 shows the configuration of a motor iron-loss calculation device according another example of embodiment 3.

As shown in FIG. 13, a motor iron-loss calculation device 1C includes a function calculation unit 7 and the correction unit 4. In the function calculation unit 7, a function having the primary frequency $\omega$ and the q-axis current iq as two variables is set in advance and stored. The function calculation unit 7 receives the primary frequency $\omega$ and the q-axis current iq, and outputs the iron-loss resistance RIL which is the calculation result of the function.

Here, the function stored in the function calculation unit 7 is generated for one set value (id$\alpha$ (100%)) of the d-axis current id, and is a function that associates one value of the iron-loss resistance RIL with respect to each combination of the primary frequency $\omega$ and the q-axis current iq. This function is information represented by a two-dimensional data map, a two-dimensional data table, or the like.

As in the above embodiment 2, the motor iron-loss calculation device 1C multiplies the iron-loss resistance RILL which is the calculation result of the function calculation unit 7 by the current vector norm to the power of 2 at the rated d-axis current idα (idα^2+iq^2), to generate the iron-loss value PILα. Then, the correction unit 4 calculates the change width ΔPIL when the q-axis current iq is 0%, and adds the change width ΔPIL to the iron-loss value PILα, to generate the iron-loss value PIL.

Thus, with the motor iron-loss calculation device 1C, the same effects as in the above embodiment 3 are obtained, and also, by using the iron-loss resistance RIL, there is an advantage that the calculation amount and the data capacity can be reduced depending on the motor type, thus obtaining the same effects as described in the above embodiment 2.

Embodiment 4

In embodiment 4, correction calculation in the correction unit 4 described in the above embodiments 1 to 3 will be described.

Figure 14:
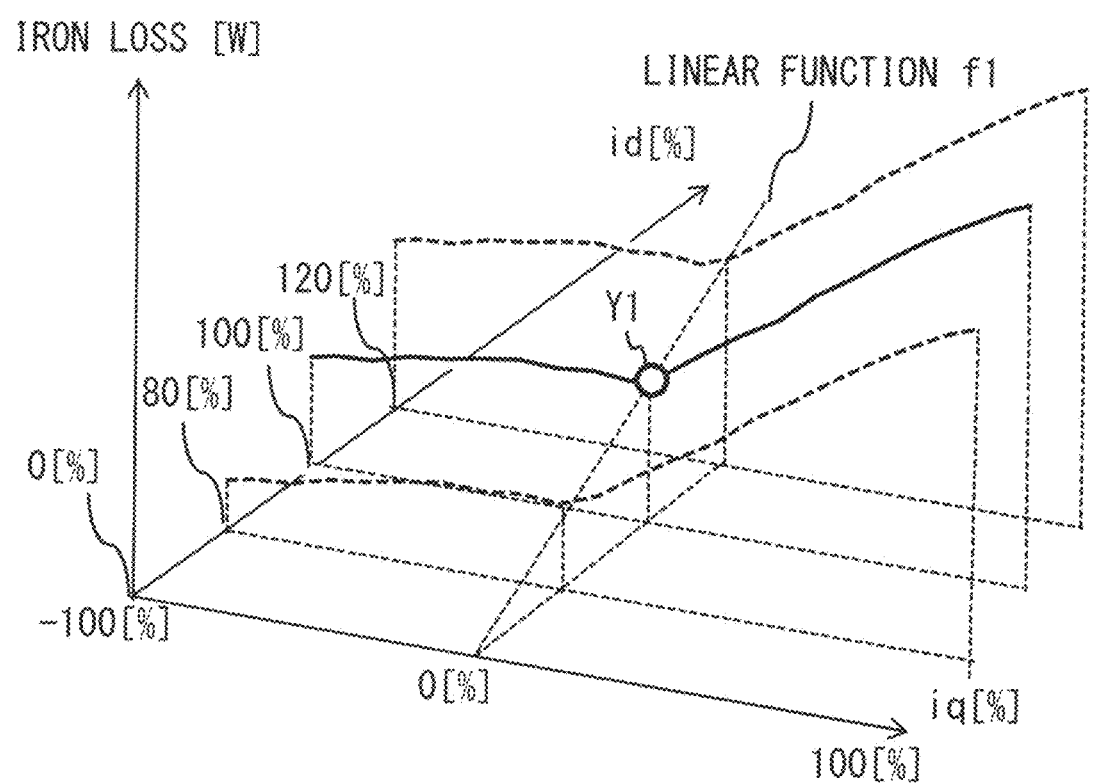
FIG. 14 illustrates correction calculation in accordance with exciting current according to embodiment 4.
Figure 15:
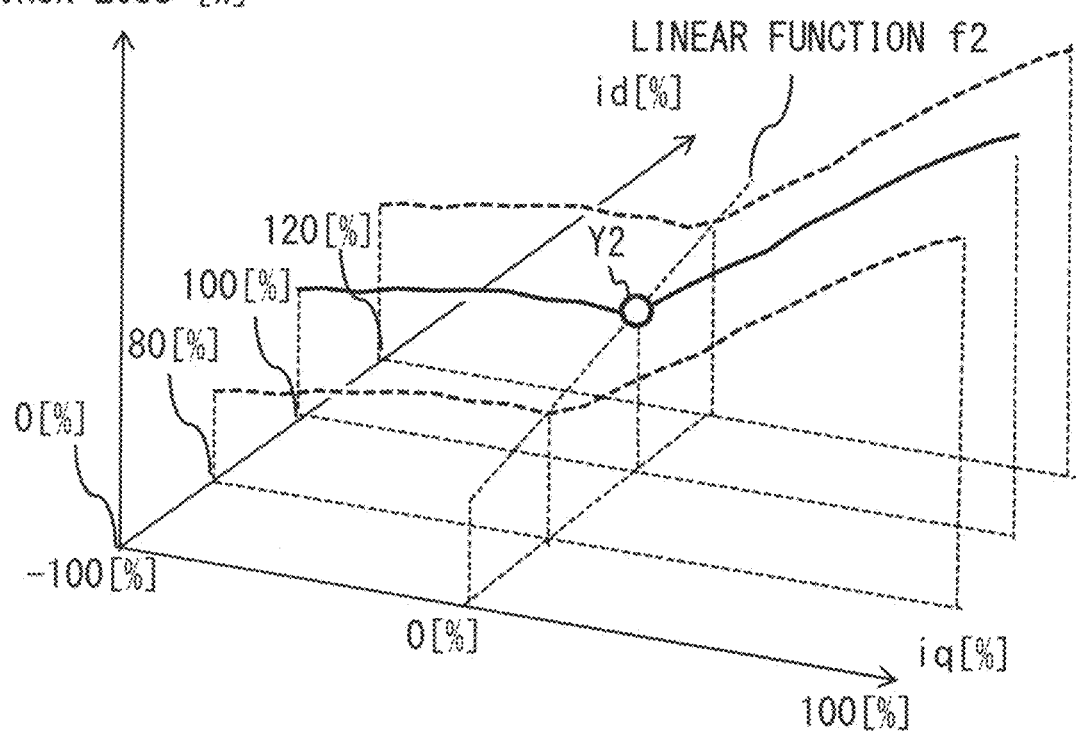
FIG. 15 illustrates correction calculation in accordance with exciting current according to another example of embodiment 4.
Figure 16:
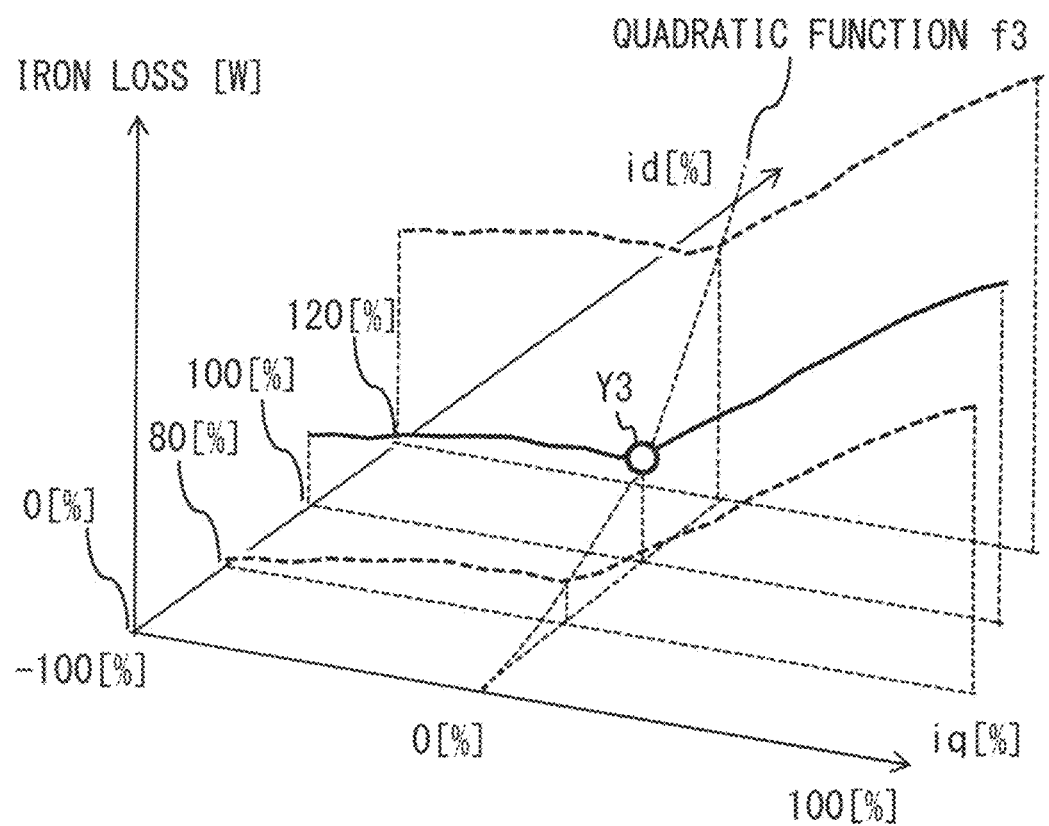
FIG. 16 illustrates correction calculation in accordance with exciting current according to another example of embodiment 4.
Figure 17:
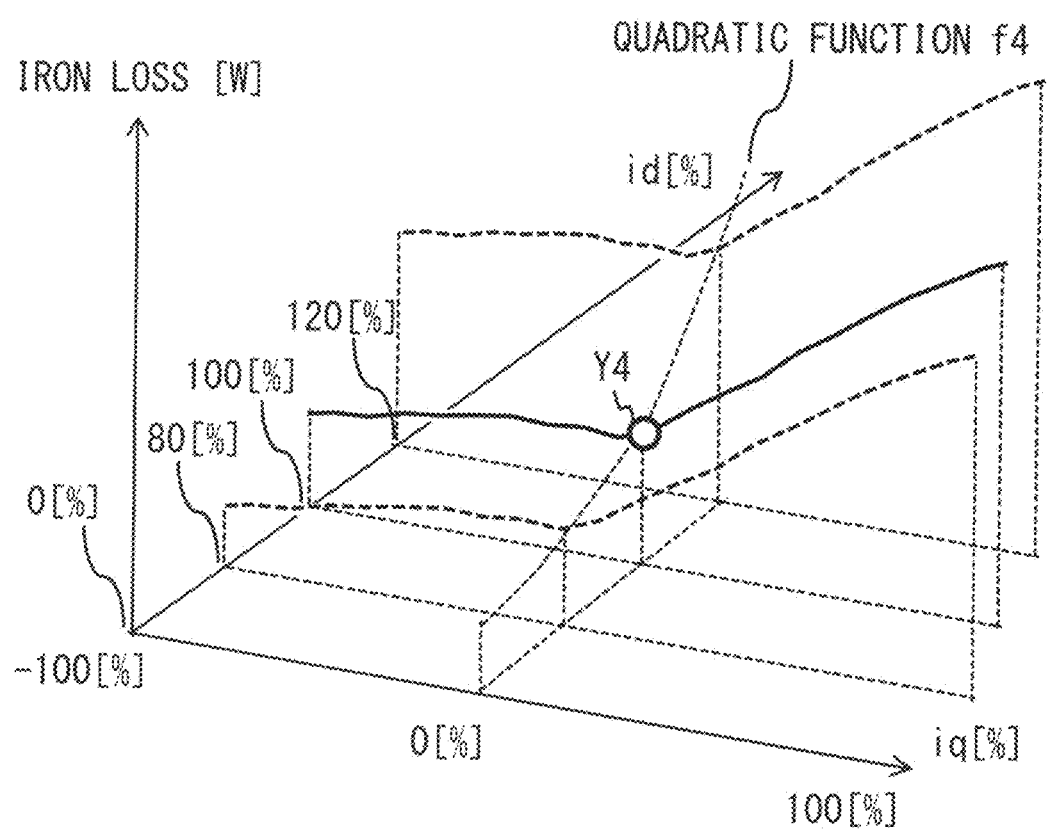
FIG. 17 illustrates correction calculation in accordance with exciting current according to another example of embodiment 4.

FIG. 14 illustrates correction calculation in accordance with exciting current according to embodiment 4. FIG. 15 to FIG. 17 each illustrate correction calculation in accordance with exciting current according to another example of embodiment 4.

In each of FIG. 14 to FIG. 17, a solid-line waveform of iron loss in a case where the d-axis current id is idα (100%) as a reference, and dotted-line waveforms of iron loss calculated through correction calculation in two cases where the d-axis current id is 80% and 120%, are shown.

In the above embodiment 1, the correction calculation in the correction unit 4 is shown by the above Expressions (4) to (6), the change width ΔPIL of iron loss when the d-axis current id changes from idα (100%) to actual id is calculated by the above Expression (5) and added to the iron-loss value PILα so as to be corrected, and the iron-loss value PIL is outputted.

In this case, when id and iq are equal to 0, the iron-loss value PIL outputted from the correction unit 4 becomes 0. Under the condition of iq=0, when the d-axis current id changes from idα (100%) to actual id, iron loss changes in accordance with a waveform of a linear function f1 shown in FIG. 14. In this case, the point Y (see FIG. 5) for the condition of idα (100%) and iq (0%) corresponds to a point Y1.

Alternatively, iron loss on the condition of iq=0 may change in accordance with a waveform of a linear function f2 shown in FIG. 15. Here, the point Y (see FIG. 5) for the condition of idα (100%) and iq (0%) corresponds to a point Y2.

In this case, the change width ΔPIL of iron loss through the change from idα (100%) to actual id is represented by the following Expression (13), using an arbitrary offset β and an arbitrary value a as a change amount with respect to id.

$$\Delta PIL = \alpha \cdot (id - id\alpha) + \beta \quad (13)$$

Still alternatively, iron loss on the condition of iq=0 may change in accordance with a waveform of a quadratic function f3 shown in FIG. 16. Here, the point Y (see FIG. 5) for the condition of idα (100%) and iq (0%) corresponds to a point Y3.

In this case, iron loss changes so as to slide in accordance with increase/decrease in the d-axis current id to the power of 2, and the change width ΔPIL of iron loss through the change from idα (100%) to actual id is represented by the following Expression (14).

$$\Delta PIL = (PIL\alpha 0/(id\alpha^2)) \cdot (id^2 - id\alpha^2) \quad (14)$$

Here, PILα0 is iron loss at the point Y3 for the condition of idα (100%) and iq (0%), i.e., the iron-loss value PILα at iq (0%).

Still alternatively, iron loss on the condition of iq=0 may change in accordance with a waveform of a quadratic function f4 shown in FIG. 17. Here, the point Y (see FIG. 5) for the condition of idα (100%) and iq (0%) corresponds to a point Y4.

In this case, the change width ΔPIL of iron loss through the change from idα (100%) to actual id is represented by the following Expression (15) using arbitrary values γ, δ, ε.

$$\Delta PIL = \gamma (id^2 - id\alpha^2) + \delta (id^2) + \varepsilon \quad (15)$$

As the calculation for the change width ΔPIL of iron loss to be added to the iron-loss value PILα, the above Expression (5) described in the above embodiment 1 is simplest and does not use a parameter of an arbitrary value. Meanwhile, in the other Expressions (13), (14), (15), the number of parameters increases, but depending on iron-loss characteristics of the motor, it becomes possible to improve iron-loss calculation accuracy. At the time of acquiring iron-loss data, measurement is performed with the d-axis current id changed as appropriate, and an appropriate expression is selected.

In an induction motor, a value obtained by multiplying the d-axis current id by the mutual inductance is a value corresponding to a secondary magnetic flux Φdr. In the above embodiments, the correction calculation in the correction unit 4 is performed on the basis of the d-axis current id, but the secondary magnetic flux Φdr may be used instead of the d-axis current id, whereby the same effects are obtained. In this case, in the above Expressions (5), (13), (14), (15), the d-axis current id is replaced with the secondary magnetic flux Φdr and the rated d-axis current idα (100%) is replaced with a rated secondary magnetic flux Φdra (100%), whereby the expression structures can be directly used.

Depending on the motor type, saturation of the mutual inductance significantly occurs, and therefore performing correction calculation using the secondary magnetic flux Φdr as a reference might ensure better calculation accuracy for iron loss. In addition, in a case where the iron loss PIL outputted from the motor iron-loss calculation device is used for control of an induction motor and the induction motor is subjected to control of the secondary magnetic flux Φdr, adopting correction calculation using the secondary magnetic flux Φdr facilitates designing and implementation of control.

Also in a case of a synchronous motor, in the above Expressions (5), (13), (14), (15), the d-axis current id may be replaced with a d-axis magnetic flux (Φe+Ld·id) and the rated d-axis current idα (100%) may be replaced with Φe, whereby correction calculation can be performed in the same manner. Here, Φe is rotor induced voltage, and LD is a d-axis inductance.

Embodiment 5

Figure 18:
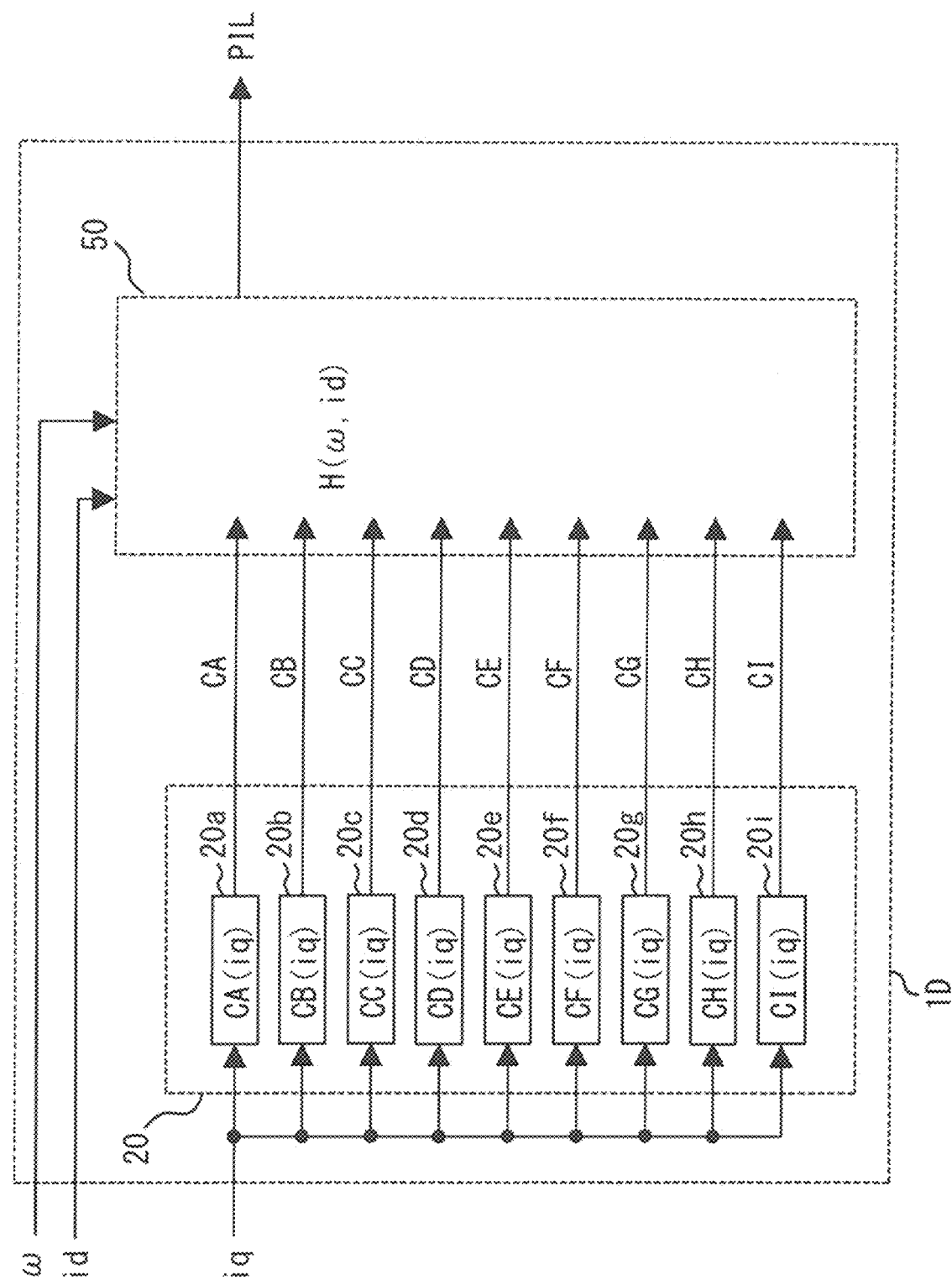
FIG. 18 shows the configuration of a motor iron-loss calculation device according to embodiment 5.

FIG. 18 shows the configuration of a motor iron-loss calculation device according to embodiment 5. In the above embodiments 1 and 2, the iron loss PIL is calculated on the basis of approximate representation using the polynomial function F(ω), G(ω) of the primary frequency ω and the coefficients. In embodiment 5, the iron loss PIL is approximately represented using a polynomial function H(ω, id) based on a binary function having the primary frequency ω and further the d-axis current id or the secondary magnetic flux Φdr as variables.

As shown in FIG. 18, a motor iron-loss calculation device 1D includes a polynomial calculation unit 50 and a coefficient conversion unit 20. In the present embodiment, the correction unit 4 is not provided, unlike the above embodiments 1 to 4.

In the polynomial calculation unit 50, the polynomial function H(ω, id) having the primary frequency ω and the d-axis current id or the secondary magnetic flux Φdr (here, the d-axis current id) as variables is set in advance.

The polynomial calculation unit 50 receives the coefficients for respective terms of the polynomial function H(ω, id), the primary frequency ω, and the d-axis current id, and outputs the iron loss PIL which is the calculation result of the polynomial function H(ω, id).

As an example, PIL and the polynomial function H(o, id) in which the primary frequency ω and the d-axis current id are used for terms up to second-order terms, are represented by the following Expression (16).

$$PIL = F(\omega) \qquad (16)$$
$$= \frac{CA \cdot \omega^2 \cdot id^2 + CB \cdot \omega^2 \cdot id + CC \cdot \omega \cdot id^2 + CD \cdot \omega \cdot id + CE \cdot id^2 +}{CF \cdot id + CG \cdot \omega^2 + CH \cdot \omega + CI}$$

Here, CA, CB, CC, CD, CE, CF, CG, CH, and CI are coefficients for the respective terms of the polynomial function H(o, id) outputted from the coefficient conversion unit 20.

In this case, the coefficient conversion unit 20 stores nine pieces of coefficient information 20a, 20b, 20c, 20d, 20e, 20f, 20g, 20h, 20i for the respective terms of H(ω, id). The coefficient conversion unit 20 receives the q-axis current iq, refers to each coefficient information 20a to 20i, and outputs coefficients CA(iq), CB(iq), CC(iq), CD(iq), CE(iq), CF(iq), CG(iq), CH(iq), CI(iq) for the respective terms of the polynomial function H(ω, id). Here, CA(iq) to CI(iq) are values of the respective coefficients CA to CI corresponding to the value of iq.

Each coefficient information 20a to 20i stored in the coefficient conversion unit 20 is a function that associates one value of each coefficient CA, CB, CC, CD, CE, CF, CC, CH, CI with the q-axis current iq as an argument. The function of each coefficient information 20a to 20i is not limited to representation by a mathematical expression, and may be represented by a data table or a data map, for which measurement information of iron loss of a target motor is collected in advance and stored.

Also in embodiment 5, iron loss which changes with the operation state of the motor (load state) can be accurately calculated, and the same effects as in the above embodiment 1 are obtained. In addition, since the polynomial function H(ω, id) based on the binary function is used, the number of pieces of the coefficient information 20a to 20i stored in the coefficient conversion unit 20 increases along with increase in the number of terms of the function, so that the data capacity or the calculation amount increase, but calculation accuracy for the iron loss PIL is improved. Further, since the d-axis current id is incorporated in calculation in advance, the correction unit 4 is not needed.

Instead of the d-axis current id of the polynomial function H(ω, id), the secondary magnetic flux Φdr may be used in a case of an induction motor.

In a case of a synchronous motor, even if the d-axis magnetic flux (Φe+Ld·id) is used, accurate iron loss can be calculated in the same manner by preparing coefficient information of the coefficient conversion unit 20 as appropriate.

Further, the iron-loss resistance RIL may be calculated using a polynomial function having the primary frequency ω and the d-axis current id as two variables, and the iron loss PIL may be generated using the iron-loss resistance RIL.

Embodiment 6

Figure 19:
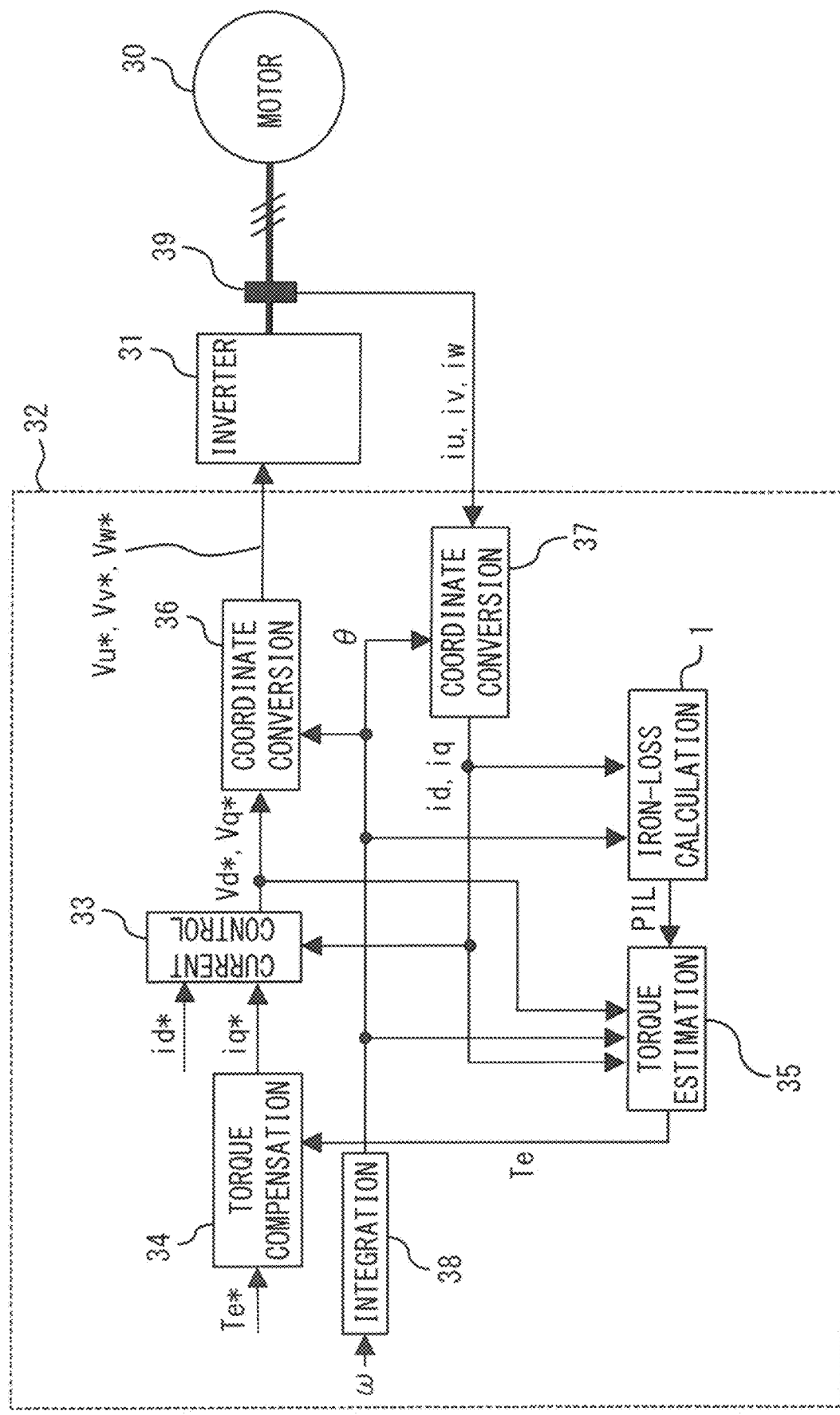
FIG. 19 shows the configuration of a motor control device according to embodiment 6.

FIG. 19 shows the configuration of a motor control device according to embodiment 6.

In the present embodiment, a motor control device that includes the motor iron-loss calculation device 1 according to the above embodiment 1 and performs torque control of a motor, will be described.

As shown in FIG. 19, the motor control device (hereinafter, simply referred to as control device 32) controls a motor 30 by performing drive control of the inverter 31. The control device 32 performs control calculation processing and outputs voltage commands Vu*, Vv*, Vw* to the inverter 31. The inverter 31 is subjected to PWM processing with which switching elements are driven, and thus supplies the motor 30 with output voltage corresponding to the voltage commands Vu*, Vv*, Vw*. A current sensor 39 detects currents iu, iv, iw of the motor 30 and transmits a signal of the detected currents to the control device 32.

The control device 32 includes a current control unit 33, a torque compensation unit 34, a torque estimation unit 35, coordinate conversion units 36, 37, an integrator 38, and the motor iron-loss calculation device 1. The coordinate conversion units 36, 37 perform coordinate conversion between a three-phase coordinate system at rest and a dq-axis rotating coordinate system having the d axis in the rotor magnetic flux direction of the motor 30.

The primary frequency ω is integrated by the integrator 38, whereby a phase θ for coordinate conversion is generated. The generated phase θ is inputted to the coordinate conversion units 36, 37. In a case of an induction motor, the primary frequency ω is the sum of an estimated electric angular velocity and a slip frequency, or the sum of an electric angular velocity and a slip frequency. In a case of a permanent magnet motor, the primary frequency co is an electric angular velocity or an estimated electric angular velocity.

By a known method, a torque command Te* is generated through control processing performed so that the motor 30 has a desired rotational speed, or a torque command Te* having a set value is used.

The torque compensation unit 34 receives the torque command Te* and estimated torque Te, performs calculation processing so that both values coincide with each other, and outputs a q-axis current command iq* which is a torque current command. In addition, by a known method, a d-axis current command id* which is an exciting current command is generated through control processing performed for the secondary magnetic flux Φdr, or id* having a set value is used.

The detected currents iu, iv, iw from the current sensor 39 are converted to currents id, iq in the dq-axis rotating coordinate system by the coordinate conversion unit 37, and then inputted to the current control unit 33. The current control unit 33 receives the detected currents id, iq on the d and q axes, and the q-axis current command iq* and the d-axis current command id*, performs calculation processing so that they respectively coincide with each other, and outputs voltage commands Vd*, Vq* on the d and q axes.

The voltage commands Vd*, Vq* are converted to three-phase voltage commands Vu*, Vv*, Vw* by the coordinate conversion unit 36, and then outputted to the inverter 31.

The motor iron-loss calculation device 1 receives the detected currents id, iq outputted from the coordinate conversion unit 37 and the primary frequency ω, performs calculation for estimating the iron loss PIL, and outputs the iron loss PIL. The torque estimation unit 35 performs torque estimation calculation using the voltage commands Vd*, Vq*, the detected currents id, iq, the primary frequency ω, the iron loss PIL, and a motor constant, to calculate the estimated torque Te.

Through the above processing, the control device 32 achieves accurate torque control.

As described above, iron loss of the motor 30 changes depending on the q-axis current iq. In addition, torque of the motor 30 also changes depending on the q-axis current iq and changes depending on the iron loss as well. Therefore, deriving a conversion table for uniquely associating the torque current iq and torque requires a lot of effort. However, in the present embodiment, a feedback loop having a combination of torque estimation and torque compensation is used, and thus an effect of making it unnecessary to derive such a conversion table is obtained.

In a case where the motor 30 is an induction motor, the torque estimation unit 35 calculates the estimated torque Te by the following Expression (17). In this case, as a substitute for output voltage of the inverter 31, the dq-axis voltage commands Vd*, Vq* are used.

$$Te=(P/\omega)((Vd^* \cdot id+Vq^* \cdot iq)-Rs \cdot (id^2+iq^2)-PIL) \quad (17)$$

Here, Vd* is the d-axis voltage command, Vq* is the q-axis voltage command, id is the d-axis current of the stator (primary), iq is the q-axis current of the stator (primary), Rs is the primary resistance, PIL is iron loss, P is the number of pole pairs, and w is the primary frequency.

The above Expression (17) is based on input/output of energy, the first term is input power to the motor 30, the second term is copper loss, and the third term is iron loss. In particular, in a case where the motor 30 is an induction motor, division by the primary frequency ω leads to incorporation of secondary copper loss at the rotor. This will be described below. In a case of an induction motor, the primary frequency ω is the sum of an electric angular frequency ωre and a slip frequency ωse, and the slip frequency ωse and the primary frequency ω are represented by the following Expressions (18) and (19), respectively. By substituting these into the above Expression (17), the following Expression (20) is obtained, showing that mechanical output Pmech which is a product of a mechanical velocity ωrm and the estimated torque Te is equivalent to a value obtained by subtracting primary copper loss, secondary copper loss, and iron loss from input power. In the fourth term of Expression (20), "M/Lr" is a coefficient for conversion between the primary side and the secondary side.

$$\omega se=(M \cdot Rr/Lr) \cdot (iq/\Phi dr)=(Rr/Lr) \cdot (iq/id) \quad (18)$$

$$\omega=\omega re+\omega se=P \cdot \omega rm+\omega se \quad (19)$$

$$\begin{aligned} Pmech &= Te \cdot \omega rm \\ &= (Vd^* \cdot id + Vq^* \cdot iq) - Rs \cdot (id^2 + iq^2) - PIL - Rr \cdot (M^2/Lr^2) \cdot iq^2 \\ &= (Vd^* \cdot id + Vq^* \cdot iq) - Rs \cdot (id^2 + iq^2) - PIL - Rr \cdot iqr^2 \end{aligned} \quad (20)$$

Here, iqr is the q-axis current of the rotor (secondary), Lr is the secondary inductance, Rr is the secondary resistance, PIL is iron loss, P is the number of pole pairs, ωrm is the mechanical angular velocity, ωse is the slip frequency, Lr is the secondary inductance, and M is the mutual inductance.

In the calculation of the above Expression (17) in the torque estimation unit 35, a used motor constant is only the primary resistance Rs, and the motor inductance and the secondary resistance are not used. Thus, there is an advantage of having robustness against variation in the values of other motor constants. The primary resistance Rs can be easily measured from the relationship between the voltage command and the detected current on the basis of Ohm's law. Therefore, as calculation accuracy for the iron loss PIL is increased, torque estimation accuracy is improved.

The motor iron-loss calculation device 1 can perform calculation accurately in accordance with the operation state of the motor as described in the above embodiment 1, and therefore accuracy of torque estimation by the torque estimation unit 35 can be improved.

Only in a case where the motor 30 is an induction motor, torque estimation may be performed by calculating a secondary magnetic flux using the following Expression (21) including an iron-loss resistance Rm. In this case, for the calculated secondary magnetic flux, a delay is imparted by a low-pass filter shown by Expression (22), and thus torque estimation is performed as shown by Expression (23).

[Mathematical 1]

$$\begin{bmatrix} \Phi dr \\ \Phi qr \end{bmatrix} = \frac{1}{\omega} \cdot \frac{Lr}{M} \cdot \begin{bmatrix} Vd^* - (Rs + Rm) \cdot iq - \omega \cdot \sigma \cdot Ls \cdot id \\ -Vq^* + (Rs + Rm) \cdot id - \omega \cdot \sigma \cdot Ls \cdot iq \end{bmatrix} \quad (21)$$

$$\begin{bmatrix} \Phi dr(LPF) \\ \Phi qr(LPF) \end{bmatrix} = \frac{1}{1 + \frac{Lr}{Rr} \cdot S} \cdot \begin{bmatrix} \Phi dr \\ \Phi qr \end{bmatrix} \quad (22)$$

$$Te = P \cdot (M/Lr) \cdot (\Phi dr(LPF) \cdot iq - \Phi qr(LPF) \cdot id) \quad (23)$$

Here, Φdr is the d-axis magnetic flux of the rotor (secondary), Φqr is the q-axis magnetic flux of the rotor (secondary), σ is a leakage coefficient, Ls is the primary inductance, Φdr (LPF) is the d-axis magnetic flux of the rotor (secondary) after low-pass filter processing, Φqr(LPF) is the q-axis magnetic flux of the rotor (secondary) after low-pass filter processing, and s is a Laplace variable.

It is known that the secondary magnetic flux of the induction motor has a delay of a secondary time constant (Rr-Lr) relative to the current on the stator side. By simulating this, torque estimation in accordance with transient change of torque of the induction motor can be performed. In other words, when the inverter output voltage is saturated, even in a motor operation state where the secondary magnetic flux dynamically changes as in flux weakening control or the like, it is possible to perform accurate torque estimation so as to follow the torque change.

In the above Expression (23), if delay characteristics imparted by Expression (22) are neglected, i.e., if Φdr(LPF)=Φdr and Φqr(LPF)=Φqr are assumed, the right-hand side of Expression (21) is substituted into the right-hand side of Expression (23) and the resultant expression is deformed to obtain the above Expression (17), thus ending up being equivalent to an expression of energy.

The calculation of the above Expression (23) requires calculation of the secondary magnetic flux and the iron-loss resistance Rm, thus increasing the calculation amount, but as described above, provides an effect of achieving torque estimation in accordance with transient characteristics of the induction motor.

The torque compensation unit 34 receives the torque command Te* and the estimated torque Te, and performs calculation processing shown by the following Expression (24), to generate the q-axis current command iq*. Expression (24) is an expression in a case where the motor 30 is an induction motor. The first term on the right-hand side is a known theoretical expression for converting the torque command Te* to the q-axis current command iq*, and in this case, is a feedforward term serving for improvement in response of torque compensation control. The second term and the third term are feedback control terms for implementing PI control, and serve for accuracy of torque compensation control.

$$iq^*=(1/(P\cdot(M/Lr)\cdot\Phi dr))\cdot Te^*+Kp\cdot(Te^*-Te)+(Ki/s)\cdot(Te^*-Te) \quad (24)$$

Here, Kp is a proportional gain of torque compensation control, and Ki is an integral gain of torque compensation control.

Through calculation processing of Expression (24), the torque command Te* and the estimated torque Te are caused to coincide with each other, whereby accurate control for output torque of the motor 30 can be achieved.

On the other hand, in a case where the motor 30 is a synchronous motor, the torque estimation unit 35 calculates the estimated torque Te by the following Expression (25). In the case of a synchronous motor, the slip frequency is absent, and therefore the primary frequency ω is equivalent to the electric angular frequency ωre of the motor.

$$Te=(P/Co)((Vd^*\cdot id+Vq^*\cdot iq)-R\cdot(id^2+iq^2)-PIL) \quad (25)$$

Here, Vd* is the d-axis voltage command, Vq* is the q-axis voltage command, id is the d-axis current of the stator, iq is the q-axis current of the stator, R is the winding resistance, PIL is iron loss, P is the number of pole pairs, and co is the primary frequency (electric angular frequency).

In the calculation of the above Expression (25), a used motor constant is only the winding resistance R, and thus robustness against variation in the values of other motor constants can be obtained as in the case of calculation using the above Expression (17). In addition, since the motor iron-loss calculation device 1 can perform calculation accurately in accordance with the operation state of the motor, accuracy of torque estimation can be improved.

Further, in the case where the motor 30 is a synchronous motor, the torque compensation unit 34 receives the torque command Te* and the estimated torque Te, and performs calculation processing shown by the following Expression (26), to generate the q-axis current command iq*.

$$iq^*=(1/(P\cdot\Phi e))\cdot Te^*+Kp\cdot(Te^*-Te)+(Ki/s)\cdot(Te^*-Te) \quad (26)$$

Here, Φe is an induced voltage constant of the rotor.

As described above, in the present embodiment, the motor control device 32 is configured to include the motor iron-loss calculation device 1 according to the above embodiment 1. Then, the motor control device 32 uses the iron-loss value PIL calculated by the motor iron-loss calculation device 1, for calculation of the estimated torque Te, and performs torque compensation control on the basis of the estimated torque Te. Thus, accurate torque control in accordance with the load (torque) state of the motor 30 can be achieved. In particular, enhanced accuracy of iron-loss calculation by the motor iron-loss calculation device 1 contributes to improvement in accuracy of torque control.

In the present embodiment, the motor iron-loss calculation device 1 according to the above embodiment 1 is applied to the motor control device 32. However, the motor iron-loss calculation devices 1A to 1D according to the other embodiments 2 to 5 can also be applied in the same manner, whereby the same effects are obtained.

Embodiment 7

Figure 20:
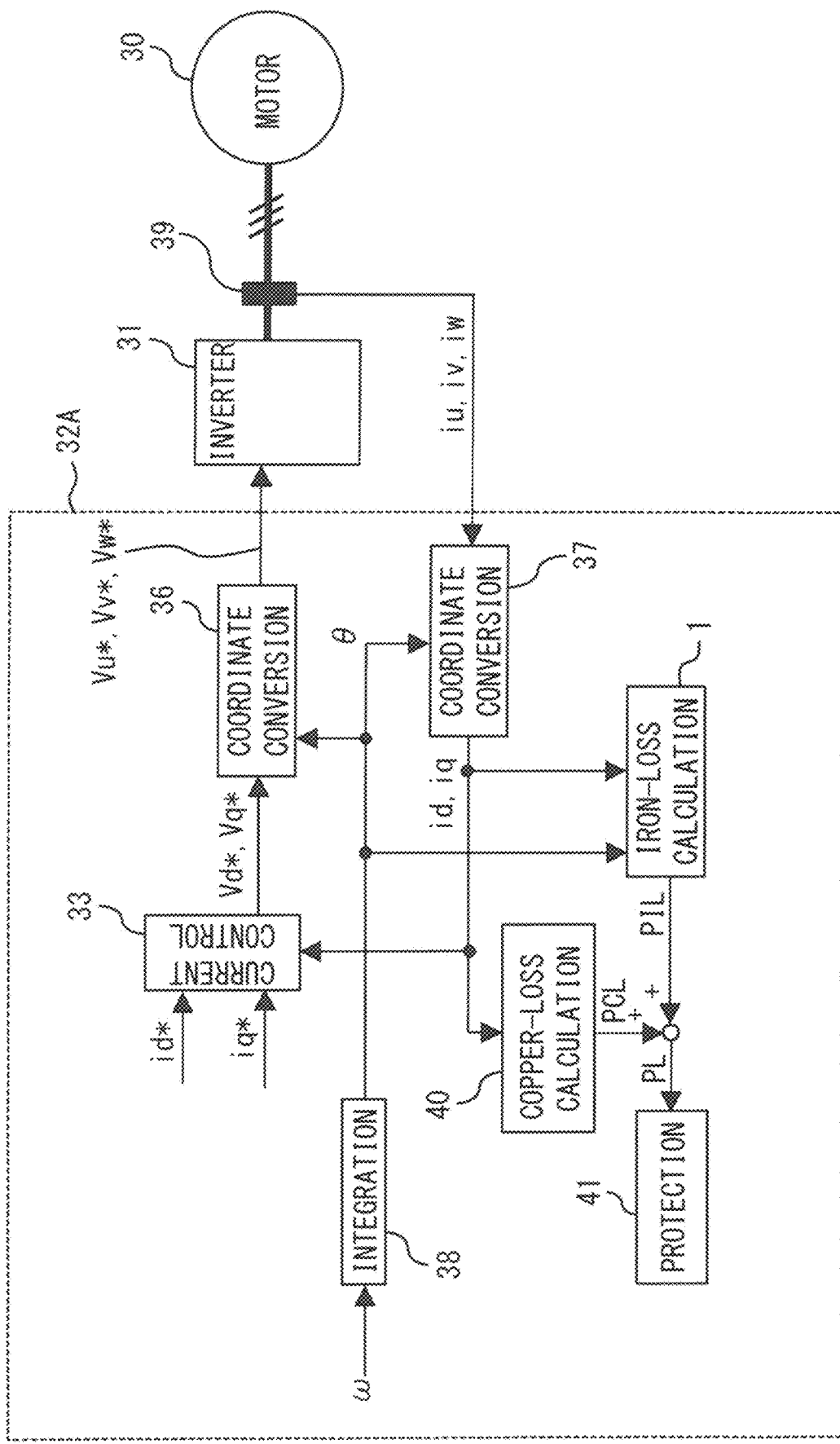
FIG. 20 shows the configuration of a motor control device according to embodiment 7.

FIG. 20 shows the configuration of the motor control device according to embodiment 7.

In the present embodiment, a motor control device that includes the motor iron-loss calculation device 1 according to the above embodiment 1 and performs overload protection for a motor, will be described. The same components as those in the above embodiment 6 are denoted by the same reference characters, and description thereof is omitted as appropriate.

As shown in FIG. 20, the motor control device (hereinafter, simply referred to as control device 32A) includes the current control unit 33, the coordinate conversion units 36, 37, the integrator 38, a copper-loss calculation unit 40, a protection unit 41 for performing overload protection, and the motor iron-loss calculation device 1.

In this case, torque compensation is not performed, and therefore the q-axis current command iq* serving for normal operation of the motor 30 is generated by a generation unit provided (not shown).

The copper-loss calculation unit 40 calculates copper loss PCL on the basis of the detected currents id, iq on the d and q axes. The copper loss PCL is calculated using the following Expression (27) in a case where the motor 30 is an induction motor, and using the following Expression (28) in a case where the motor 30 is a synchronous motor.

$$PCL=Rs\cdot(id^2+iq^2)+Rr\cdot igr^2 \quad (27)$$

$$PCL=R\cdot(id^2+iq^2) \quad (28)$$

In this case, the copper loss PCL is used for overload protection for preventing stator burnout. Therefore, the second term in the above Expression (27), which indicates rotor copper loss, may be omitted.

The iron loss PIL calculated by the motor iron-loss calculation device 1 and the copper loss PCL are added, to obtain motor loss PL, which is then inputted to the protection unit 41.

The protection unit 41 receives the motor loss PL and compares the motor loss PL with a set threshold. If the motor loss PL exceeds the threshold, the protection unit 41 performs protection processing for preventing overload. As the protection processing, processing of decreasing current of the motor 30 or stopping current application to the motor 30 is performed.

Alternatively, the protection unit 41 may estimate a motor temperature by inputting the motor loss PL to a thermal network model of the motor 30, and may perform protection processing if the estimated motor temperature exceeds a set value.

As described above, in the present embodiment, the motor control device 32A is configured to include the motor iron-loss calculation device 1 according to the above embodiment 1. Then, the motor control device 32A calculates the motor loss PL using the iron-loss value PIL calculated by the motor iron-loss calculation device 1, to perform overload protection. Thus, the motor loss PL can be calculated accurately, so that reliability of overload protection is improved.

Also in the present embodiment, the motor iron-loss calculation devices 1A to 1D according to embodiments 2 to 5 can be applied in the same manner, whereby the same effects are obtained.

In addition, the overload protection in the present embodiment may be applied to the above embodiment 6, whereby improvement in accuracy of torque control and improvement in reliability of overload protection can be both achieved.

Although the disclosure is described above in terms of various exemplary embodiments and implementations, it should be understood that the various features, aspects, and functionality described in one or more of the individual embodiments are not limited in their applicability to the particular embodiment with which they are described, but instead can be applied, alone or in various combinations to one or more of the embodiments of the disclosure.

It is therefore understood that numerous modifications which have not been exemplified can be devised without departing from the scope of the present disclosure. For example, at least one of the constituent components may be modified, added, or eliminated. At least one of the constituent components mentioned in at least one of the preferred embodiments may be selected and combined with the constituent components mentioned in another preferred embodiment.

DESCRIPTION OF THE REFERENCE CHARACTERS 1, 1A to 1D motor iron-loss calculation device
2 coefficient conversion unit
2a, 2b, 2c coefficient information
3 polynomial calculation unit
4 correction unit
5 coefficient conversion unit
5a, 5b, 5c coefficient information
6, 7 function calculation unit
20 coefficient conversion unit
20a to 20i coefficient information
30 motor
32, 32A motor control device
34 torque compensation unit
35 torque estimation unit
36, 37 coordinate conversion unit
41 protection unit
50 polynomial calculation unit
A0, A1, A2 coefficient
B0, B1, B2 coefficient
CA, CB, CC, CD, CE, CF, CG, CH, CI coefficient
F(ω), G(ω) H(ω, id) polynomial function
id d-axis current
iq q-axis current
PIL, PILα iron-loss value
RIL iron-loss resistance
Te estimated torque
Te* torque command
Vd*, Vq* dq-axis voltage command
ω primary frequency
Φdr secondary magnetic flux
θ phase

The invention claimed is:

1. A motor iron-loss calculation device configured to calculate an iron-loss value of a motor on the basis of a primary frequency of the motor and a q-axis current component in a dq-axis rotating coordinate system having a d axis in a rotor magnetic flux direction of the motor,
the motor iron-loss calculation device comprising:
a polynomial calculation circuitry in which a polynomial function having the primary frequency as a variable is set in advance, and which receives a coefficient for each term of the polynomial function and the primary frequency, and outputs a calculation result of the polynomial function; and
a coefficient conversion circuitry in which coefficient information for each term of the polynomial function is stored, and which receives the q-axis current component, refers to the coefficient information, and outputs the coefficient for each term of the polynomial function, wherein
the polynomial calculation circuitry substitutes the coefficient outputted from the coefficient conversion circuitry and the primary frequency into the polynomial function, and outputs the calculation result, and
the iron-loss value of the motor is calculated on the basis of the calculation result.

2. The motor iron-loss calculation device according to claim 1, wherein
the coefficient information stored for each term of the polynomial function in the coefficient conversion circuitry is generated for one set value of a d-axis current component, and is a function that associates one value of the coefficient with respect to each value of the q-axis current component.

3. The motor iron-loss calculation device according to claim 1, wherein
the polynomial calculation circuitry outputs an iron-loss resistance as the calculation result.

4. The motor iron-loss calculation device according to claim 1, wherein
the calculated iron-loss value is subjected to correction calculation in accordance with one of a d-axis current component and a motor magnetic flux.

5. The motor iron-loss calculation device according to claim 1, wherein
the polynomial function is a binary function further having one of a d-axis current component and a secondary magnetic flux as a variable, and
the polynomial calculation circuitry further substitutes the one of the d-axis current component and the secondary magnetic flux into the polynomial function, and outputs the calculation result.

6. The motor iron-loss calculation device according to claim 5, wherein
the polynomial calculation circuitry outputs an iron-loss resistance as the calculation result.

7. A motor control device comprising:
current control circuitry configured to detect current in a dq-axis rotating coordinate system having a d axis in a rotor magnetic flux direction of a motor and generate a voltage command so that the detected current follows a command value;

coordinate conversion circuitry that uses a phase of the dq-axis rotating coordinate system calculated on the basis of a given primary frequency to perform coordinate conversion between the dq-axis rotating coordinate system and a three-phase coordinate system at rest, for both of the detected current and the voltage command; and the motor iron-loss calculation device according to claim 1, to calculate the iron-loss value of the motor.

8. The motor control device according to claim 1, further comprising:

a torque estimation circuitry which calculates estimated torque on the basis of the voltage command, the detected current, the primary frequency, and the calculated iron-loss value; and a torque compensation circuitry which calculates a q-axis current command in the command value so that the estimated torque coincides with a given torque command.

9. The motor control device according to claim 7, further comprising a protection circuitry which performs overload protection on the basis of the calculated iron-loss value.

10. The motor iron-loss calculation device according to claim 2, wherein the polynomial calculation circuitry outputs an iron-loss resistance as the calculation result.

11. The motor iron-loss calculation device according to claim 2, wherein the calculated iron-loss value is subjected to correction calculation in accordance with one of a d-axis current component and a motor magnetic flux.

12. The motor iron-loss calculation device according to claim 3, wherein the calculated iron-loss value is subjected to correction calculation in accordance with one of a d-axis current component and a motor magnetic flux.

13. A motor iron-loss calculation device comprising:

a processor and memory configured to calculate an iron-loss value of a motor on the basis of a primary frequency of the motor and a q-axis current component in a dq-axis rotating coordinate system having a d axis in a rotor magnetic flux direction of the motor, wherein the calculated iron-loss value is subjected to correction calculation by adding a iron-loss correction amount calculated using one of a d-axis current component and a motor magnetic flux.

14. The motor iron-loss calculation device according to claim 13, comprising a function calculation circuitry in which a function having the primary frequency and the q-axis current component as two variables is set in advance and stored, and which receives the primary frequency and the q-axis current component, and outputs a calculation result of the function, wherein the iron-loss value of the motor is calculated on the basis of the calculation result.

15. The motor iron-loss calculation device according to claim 14, wherein the function stored in the function calculation circuitry is generated for one set value of a d-axis current component.

16. The motor iron-loss calculation device according to claim 14, wherein the function calculation circuitry outputs an iron-loss resistance as the calculation result.

17. The motor iron-loss calculation device according to claim 15, wherein the function calculation circuitry outputs an iron-loss resistance as the calculation result.

18. A motor control device comprising:

current control circuitry configured to detect current in a dq-axis rotating coordinate system having a d axis in a rotor magnetic flux direction of a motor and generate a voltage command so that the detected current follows a command value;

coordinate conversion circuitry that uses a phase of the dq-axis rotating coordinate system calculated on the basis of a given primary frequency to perform coordinate conversion between the dq-axis rotating coordinate system and a three-phase coordinate system at rest, for both of the detected current and the voltage command; and the motor iron-loss calculation device according to claim 13, to calculate the iron-loss value of the motor.

19. The motor control device according to claim 18, further comprising:

a torque estimation circuitry which calculates estimated torque on the basis of the voltage command, the detected current, the primary frequency, and the calculated iron-loss value; and a torque compensation circuitry which calculates a q-axis current command in the command value so that the estimated torque coincides with a given torque command.

20. The motor control device according to claim 18, further comprising a protection circuitry which performs overload protection on the basis of the calculated iron-loss value.

* * * * *